United States Patent [19]
Iwao et al.

[11] Patent Number: 5,945,846
[45] Date of Patent: Aug. 31, 1999

[54] CLOCK DRIVER CIRCUIT IN A CENTRALLY LOCATED MACRO CELL LAYOUT REGION

[75] Inventors: Takenobu Iwao; Nobuyuki Ikeda; Miho Yokota, all of Tokyo, Japan

[73] Assignee: Mitsubishi Denki Kabushiki Kaisha, Tokyo, Japan

[21] Appl. No.: 08/867,391

[22] Filed: Jun. 2, 1997

[30] Foreign Application Priority Data

Nov. 29, 1996 [JP] Japan ..................................... 8-319745

[51] Int. Cl.⁶ .......................... H03K 19/01; H01L 27/10
[52] U.S. Cl. ............................. 326/101; 326/47; 326/93; 327/295; 257/206; 257/207
[58] Field of Search ................. 326/41, 47, 101, 326/93, 102, 103; 327/293, 297; 257/206, 207, 208

[56] References Cited

U.S. PATENT DOCUMENTS

| | | | |
|---|---|---|---|
| 5,270,592 | 12/1993 | Takahashi et al. | 326/93 |
| 5,298,774 | 3/1994 | Ueda et al. | 257/206 |
| 5,430,397 | 7/1995 | Itoh et al. | 326/101 |
| 5,444,276 | 8/1995 | Yokota et al. | |
| 5,519,351 | 5/1996 | Matsumoto | 327/295 |
| 5,608,484 | 3/1997 | Nomura | 326/93 |
| 5,773,855 | 6/1998 | Colwell et al. | 257/206 |

FOREIGN PATENT DOCUMENTS

| | | |
|---|---|---|
| 61-226943 | 10/1986 | Japan. |
| 6-236923 | 8/1994 | Japan. |
| 07014994 | 1/1995 | Japan. |

*Primary Examiner*—Michael Tokar
*Assistant Examiner*—Richard Roseen
*Attorney, Agent, or Firm*—Burns, Doane, Swecker & Mathis, L.L.P.

[57] ABSTRACT

A clock driver circuit is furnished in a centrally located macro cell layout region. The clock driver circuit has a plurality of predrivers and a plurality of main drivers. The input and output nodes of the predrivers are short-circuited by a first and a second common line, and the input and output nodes of the main drivers are short-circuited by the second and a third common line. A plurality of clock driver circuits are formed predetermined distances apart and arranged to intersect the clock driver circuit perpendicularly. Each of the clock driver circuits has a plurality of predrivers and a plurality of main drivers. The input and output nodes of the predrivers are short-circuited by a fourth and a fifth common line, and the input and output nodes of the main drivers are short-circuited by the fifth and a sixth common line. The third and the fourth common lines are interconnected. The sixth common line is connected to clock signal supply lines which in turn are connected to a plurality of second macro cells.

17 Claims, 10 Drawing Sheets

CLOCK DRIVER CIRCUIT IN A CENTRALLY LOCATED MACRO CELL LAYOUT REGION

BACKGROUND OF THE INVENTION

1. Field of the Invention

The present invention relates to a semiconductor integrated circuit device such as a gate array or an embedded cell array (ECA), and more particularly, to a clock driver circuit furnished in that semiconductor integrated circuit device.

2. Background Art

In semiconductor integrated circuit devices including gate arrays and embedded cell arrays (ECA), their core regions have two kinds of macro cells formed therein, i.e., a plurality of macro cells acting as logic circuits (such as AND and/or OR circuits), and a plurality of macro cells acting as internal circuits (such as flip-flop circuits), each kind requiring a clock signal. Clock driver circuits are furnished to supply clock signals to the multiple internal circuits.

In recent years, semiconductor integrated circuit devices have been required to be larger in scale and faster in operation than ever before. The requirements have prompted a proposal, among others, to increase the number of internal circuits in each semiconductor integrated circuit device and to supply the internal circuits with clock signals more efficiently with smaller clock skews. FIG. 14 is a plan pattern view of a conventional semiconductor integrated circuit device based on that proposal. This conventional integrated circuit is disclosed illustratively in Japanese Patent Laid-Open Publication No. Hei 7-14994.

In FIG. 14, a semiconductor substrate 100 comprises an internal integrated circuit group (core region) 101 and oppositely positioned peripheral circuit groups (buffer regions) 102. A first signal driver circuit (clock input driver) 103 is located in one of the oppositely positioned peripheral circuit groups 102. The first signal driver circuit amplifies a reference signal (clock signal). A plurality of second signal driver circuits (column drivers) 104 are located in another one of the oppositely positioned peripheral circuit groups 102 contiguous to the first peripheral circuit group. The second signal driver circuits 104 are positioned at both ends of the internal integrated circuit group 101 contiguous to the peripheral circuit groups 102. First signal lines 105 connect the first and second signal driver circuits 103 and 104. Second signal lines 106 connect the second signal driver circuits 104 to the internal integrated circuit group 101.

In the setup described above, the first signal driver circuit 103 amplifies the reference signal. The amplified reference signal is fed to the second signal driver circuits 104 via the first signal lines 105 arranged symmetrically as viewed from the first signal driver circuit 103. The second signal driver circuits 104 amplify the reference signal allowing a uniform reference signal to be supplied onto the second signal lines 106 wired in a comb-like manner. This makes it possible to minimize fluctuations in the reference signal reaching the internal integrated circuit group 101. Using the reference signal with reduced signal delays, i.e., with reduced clock skews, the internal integrated circuit group 101 processes various signals.

Another technique proposed in connection with the semiconductor integrated circuit device described above involves installing an easy-to-install clock driver circuit of high driving capacity without increasing the area of the semiconductor substrate. FIG. 15 is a partial plan pattern view of another conventional semiconductor integrated circuit device based on the above proposal and is disclosed illustratively in Japanese Patent Laid-Open Publication No. Hei 6-236923.

In FIG. 15, a macro cell layout region 201 is disposed on the semiconductor substrate 100. A power supply line 202a provides a supply potential VDD. The power supply line 202a is composed of a second aluminum wiring layer that is formed perpendicularly to the macro cell layout region 201. A ground line 202b provides a ground potential GND. The ground line 202b is also made of the second aluminum wiring layer formed perpendicularly to the macro cell layout region 201 and in parallel with the power supply line 202a. The ground line 202b and power supply line 202a constitute a power supply line pair. A power supply line 203a is located above the macro cell layout region. The power supply line 203a is connected to the power supply line 202a via through holes 204a, and is made of a first aluminum wiring layer. A ground line 203b is located below the macro cell layout region. The ground line 203b is connected to the ground line 202b via through holes 204b, and is made of the first aluminum wiring layer.

Also in FIG. 15, a macro cell 205 is located below the power supply lines in the macro cell layout region, and has functions including that of driver circuits. An input signal line 206 is connected to the input node of the macro cell 205 via a through hole 207 in order to input signals to that cell. Made of the second aluminum wiring layer, the input signal line 206 extends between the power supply line 202a and the ground line 202b in parallel therewith. An output signal line 208 is connected to the output node of the macro cell 205 via through holes 209 in order to output signals from that cell. Composed of the second aluminum wiring layer, the output signal line 208 also extends between the power supply line 202a and the ground line 202b in parallel therewith.

In the conventional semiconductor integrated circuit device of the type outlined above, the macro cell 205, having functions including that of driver circuits, is located below the power supply line pair made up of the power supply line 202a and ground line 202b. This setup facilitates the supply of power to the macro cell 205 and helps reduce the area occupied by the macro cell 205 on the semiconductor substrate.

As semiconductor integrated circuit devices are required to be larger in scale and faster in operation than ever before, there is a growing need for a clock driver circuit offering a higher-than-ever driving capability with smaller clock skews.

SUMMARY OF THE INVENTION

It is therefore an object of the present invention to provide a semiconductor integrated circuit device, such as a gate array and an embedded cell array (ECA), including a plurality of internal circuits, each internal circuit requiring a clock signal, with a clock signal having a minimum clock skew.

It is another object of the invention to provide a semiconductor integrated circuit device, such as a gate array and an embedded cell array (ECA), including a plurality of internal circuits, each internal circuit requiring a clock signal, and clock driver circuits installed in each of a plurality of macro cell layout regions, with a clock signal having a minimum clock skew without reducing the area occupied by other macro cells.

According to one aspect of the present invention, a semiconductor integrated circuit device comprises a semiconductor substrate having a plurality of macro cell layout regions arranged in a first direction on a principal plane of the substrate.

A plurality of electrode pairs are arranged in a second direction perpendicularly intersecting the first direction in each of the plurality of macro cell layout regions of the semiconductor substrate.

Each of the plurality of macro cell layout regions on the semiconductor substrate includes a plurality of N-type diffusion areas each arranged in the second direction and a plurality of P-type diffusion areas each arranged in the second direction, each of the plurality of N-type diffusion areas and the plurality of P-type diffusion areas being oriented in the first direction.

Each of the plurality of electrode pairs is made up of a first and a second electrode. The first electrode is formed, together with an interposing insulation film, between a contiguous two of the plurality of N-type diffusion areas furnished in each of the plurality of macro cell layout regions. The second electrode is formed, together with an interposing insulation film, between a contiguous two of the plurality of P-type diffusion areas which are arranged along with the first electrode in the first and which are furnished in the macro cell layout region in question. Each of the plurality of electrode pairs and the N- and P-type diffusion layers, located on both sides of the electrode pair in question, constitute a basic cell.

A first macro cell which is made up of a predetermined number of contiguous basic cells and which acts as a logic circuit is furnished to each of the plurality of macro cell layout regions on the semiconductor substrate. A second macro cell which is made up of a predetermined number of contiguous basic cells and which acts as an internal circuit requiring a clock signal is furnished to each of at least two of the plurality of macro cell layout regions on the semiconductor substrate.

The semiconductor integrated circuit device further comprises a first clock driver circuit including a plurality of predrivers and a plurality of main drivers. The plurality of predrivers are arranged at predetermined distances apart and are formed by a predetermined number of contiguous basic cells in one of the plurality of macro cell layout regions on the semiconductor substrate. The plurality of main drivers are arranged at predetermined distances apart and are formed by a predetermined number of contiguous basic cells in the macro cell layout regions provided with the plurality of predrivers on the semiconductor substrate.

A first common line is formed linearly in the second direction along the macro cell layout region. The macro cell layout region is provided with the plurality of predrivers and the plurality of main drivers. The first common line is electrically connected to the input nodes of the plurality of predrivers in the first clock driver circuit.

A second common line is formed linearly in the second direction along the macro cell layout region. The macro cell region is provided with the plurality of predrivers and the plurality of main drivers. The second common line is electrically connected to the output nodes of the plurality of predrivers, as well as, to the input nodes of the plurality of main drivers in the first clock driver circuit.

A third common line is formed linearly in the second direction along the macro cell layout region. The macro cell layout region is provided with the plurality of predrivers and the plurality of main drivers. The third common line is electrically connected to the output nodes of the plurality of main drivers.

The plurality of macro cell layout regions on the semiconductor substrate are divided into a plurality of portions in the second direction, and each of the divided portions is provided with a second clock driver circuit. Each of the second clock driver circuits in the corresponding divided portion comprises a plurality of predrivers that are composed of a predetermined number of contiguous basic cells and are linearly arranged. The plurality of predrivers are furnished to each of at least two of the plurality of macro cell layout regions on the semiconductor substrate. A plurality of main drivers that are composed of a predetermined number of contiguous basic cells are each provided with the plurality of predrivers and are linearly arranged. The plurality of main drivers are furnished to each of at least two macro cell layout regions other than those provided with the plurality of predrivers on the semiconductor substrate.

In each of the divided portions, a fourth common line is formed linearly in the first direction on the plurality of predrivers and the plurality of main drivers in the second clock driver circuit of the divided portion in question. The fourth common line is electrically connected to input nodes of the plurality of predrivers in the second clock driver circuit of the divided portion in question, and is further connected electrically to the third common line.

A fifth common line is formed linearly in the first direction on the plurality of predrivers and the plurality of main drivers in the second clock driver circuit of the corresponding divided portion. The fifth common line is electrically connected to output nodes of the plurality of predrivers in the second clock driver circuit of the corresponding divided portion. The fifth common line is further connected electrically to input nodes of the plurality of main drivers in the second clock driver circuit of the corresponding divided portion.

A sixth common line is formed linearly in the first direction on the plurality of predrivers and the plurality of main drivers in the second clock driver circuit of the corresponding divided portion. The sixth common line is electrically connected to output nodes of the plurality of main drivers in the second clock driver circuit of the corresponding divided portion.

A plurality of clock signal supply lines correspond to the plurality of macro cell layout regions each having the second macro cell. The plurality of clock signal supply lines are linearly arranged in the second direction and connected electrically to the sixth common line. The plurality of clock signal supply lines are further connected electrically to a clock input node of an internal circuit acting as the second macro cell furnished to the corresponding macro cell layout region.

In another aspect of the present invention, in the semiconductor integrated circuit device, the macro cell layout region provided with the first clock driver circuit is located centrally in the first direction.

In another aspect of the present invention, in the semiconductor integrated circuit device, the third and the fourth common lines are electrically connected to each other at a point of intersection therebetween.

In another aspect of the present invention, the semiconductor integrated circuit device further comprises a clock input driver formed on the principal plane of the semiconductor substrate. An input node of the clock input driver is electrically connected via a clock input line to a clock input pad formed on the principal plane of the semiconductor substrate. An output node of the clock input driver is electrically connected to the first common line.

In another aspect of the present invention, in the semiconductor integrated circuit device, the clock input driver is located in the macro cell layout region provided with the first clock driver circuit.

In another aspect of the present invention, in the semiconductor integrated circuit device, the fourth, fifth, and sixth common lines are located centrally in the second direction in the corresponding divided portion, and the central portion of the plurality of clock signal supply lines furnished to the corresponding divided portion is connected electrically to the sixth common line.

In another aspect of the present invention, in the semiconductor integrated circuit device, each of the divided portions comprises at least one power supply line pair. The supply line pair is composed of a power supply line fed with a supply potential and of a ground line adjacent to and in parallel with the power supply line and fed with a ground potential. The power supply line pair is linearly formed in the first direction on the principal plane of the semiconductor substrate. The plurality of predrivers and the plurality of main drivers in each of the divided portions are located between the power supply line and the ground line constituting the one power supply line pair furnished to the corresponding divided portion.

Other features and advantages of the present invention will become more apparent from the following description taken together with the accompanying drawings.

DETAILED DESCRIPTION OF THE PREFERRED EMBODIMENTS

Preferred embodiments of the present invention will hereinafter be described in detail with reference to the accompanying drawings.

First Exemplary Embodiment

A first Exemplary embodiment of the present invention will now be described with reference to FIGS. 1 through 10. First described below with reference to FIGS. 1 and 2 are a semiconductor substrate and a master chip of a semiconductor integrated circuit device such as a gate array or an embedded cell array practiced as the first exemplary embodiment of the invention.

Figure 1:
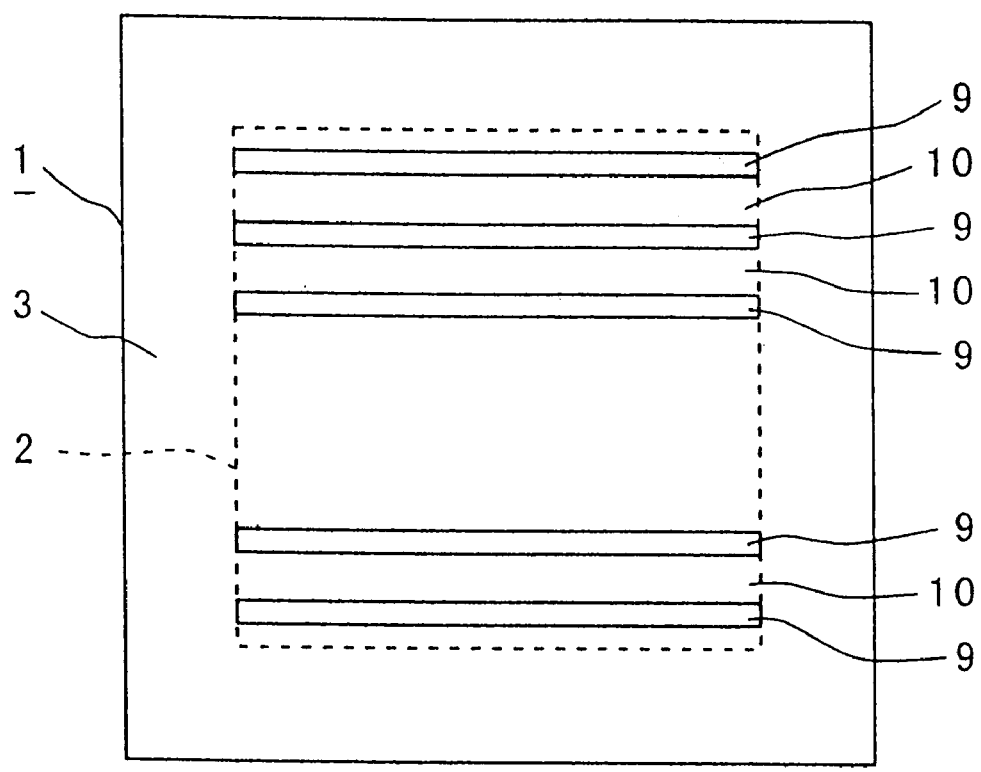
FIG. 1 is a schematic plan view of a master chip used by a semiconductor integrated circuit device embodying the present invention.

In the first exemplary embodiment, as shown in FIG. 1, a semiconductor substrate 1 has a cell region (internal region or core region) 2 on a principal plane surrounded by buffer region (peripheral region) 3. In the cell region 2 on the principal plane of the semiconductor substrate 1, as illustrated in FIG. 2, first electrodes 4 and second electrodes 5, each oriented in a first direction (longitudinally in the figure), make up electrode pairs and the electrode pairs are arranged in a second direction (crosswise in the figure). The electrodes pairs constitute a plurality of electrode pair groups arranged in the first direction.

Figure 2:
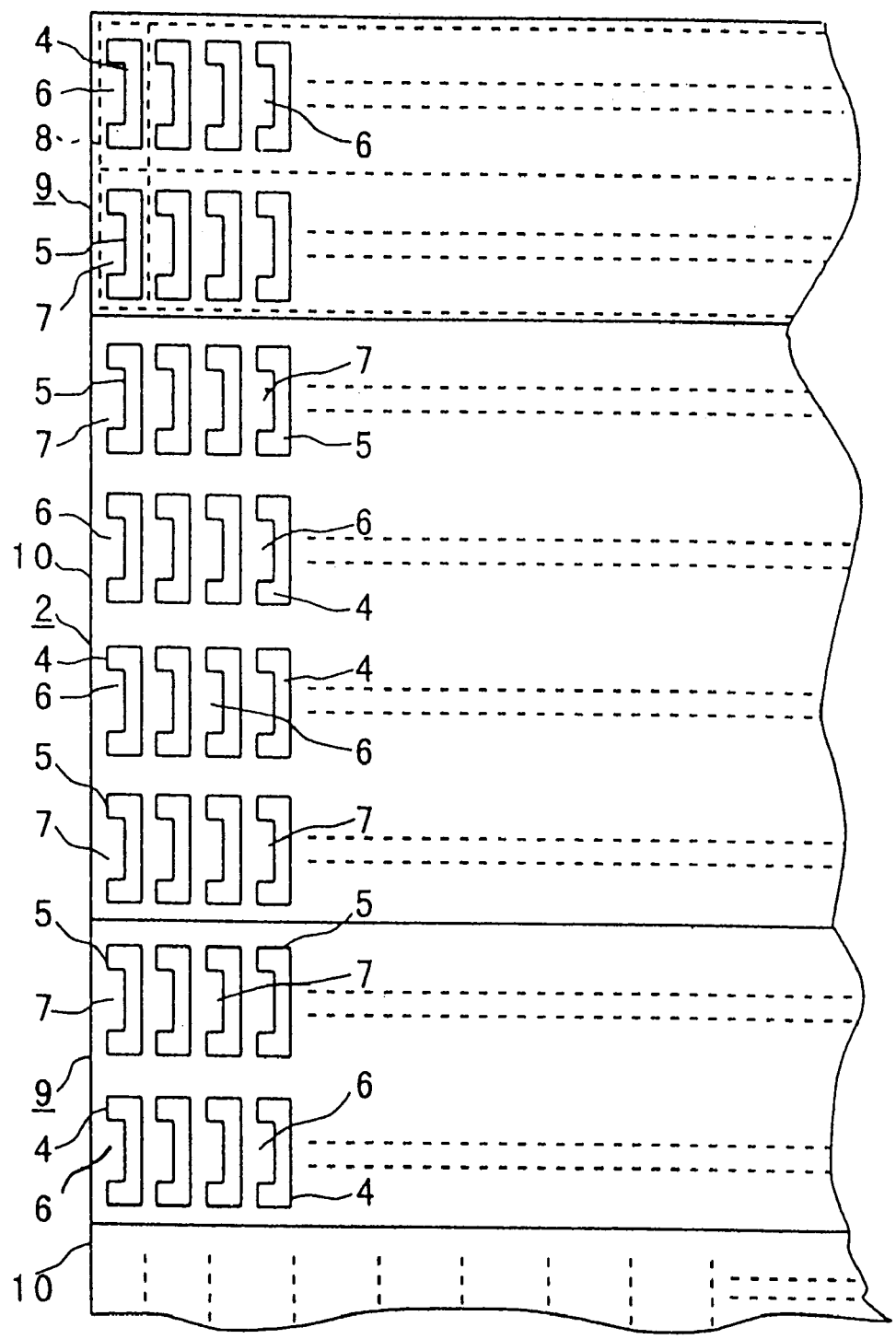
FIG. 2 is a partially enlarged view of the device shown schematically in FIG. 1.

Also in the cell region 2 on the principal plane of the semiconductor substrate 1, as shown in FIG. 2, a plurality of N-type diffusion areas 6 are arranged in the second direction corresponding to the first electrodes 4 of each electrode pair group. In addition, a plurality of P-type diffusion areas 7 are arranged also in the second direction corresponding to the second electrodes 5 of each electrode pair group. These electrode pair groups are arranged in the first direction.

Each first electrode 4 and the adjacent two N-type diffusion areas 6 constitute an N-type MOS transistor, and each second electrode 5 and the adjacent two P-type diffusion areas 7 make up a P-type MOS transistor. One N-type MOS transistor and one P-type MOS transistor arranged in the first direction constitute a basic cell 8. The cell region 2 of the semiconductor substrate 1 is filled with basic cells 8, each cell made up of an N-type and a P-type MOS transistor and arranged in the first and the second directions in a matrix fashion. The cell region 2 of the semiconductor substrate 1, when filled with the basic cells, constitutes what is known as a master chip.

Logic circuits including AND and/or OR circuits and internal circuits such as flip-flop circuits requiring a clock signal are arranged in a cell structure comprising a predetermined numbers of basic cells. In the description that follows, the logic circuits and the internal circuits are called a first macro cell and a second macro cell, respectively.

Accordingly, in the cell region 2 of the semiconductor substrate 1, as shown in FIG. 1, a plurality of macro cell layout regions 9 are positioned in the first direction. Between every two macro cell layout regions 9 is a wiring region 10. Each wiring region 10 electrically interconnects the macro cells in the macro cell layout regions 9.

Each macro cell layout region 9 is made up of a row of basic cells 8 arranged in the second direction. Each wiring region 10 is composed of one or a plurality of lines formed in the second direction corresponding to the number of rows of basic cells arranged in the second direction. The buffer regions 3 on the semiconductor substrate 1 accommodate circuits including input buffer circuits, output buffer circuits, and input/output buffer circuits.

In the semiconductor integrated circuit device of the above described construction, each clock driver circuit is formed in each second macro cell constituting the internal circuits, such as flip-flop circuits, requiring a clock signal. Clock driver circuits are used to supply the semiconductor integrated circuit device with external clock signals.

Figure 3:
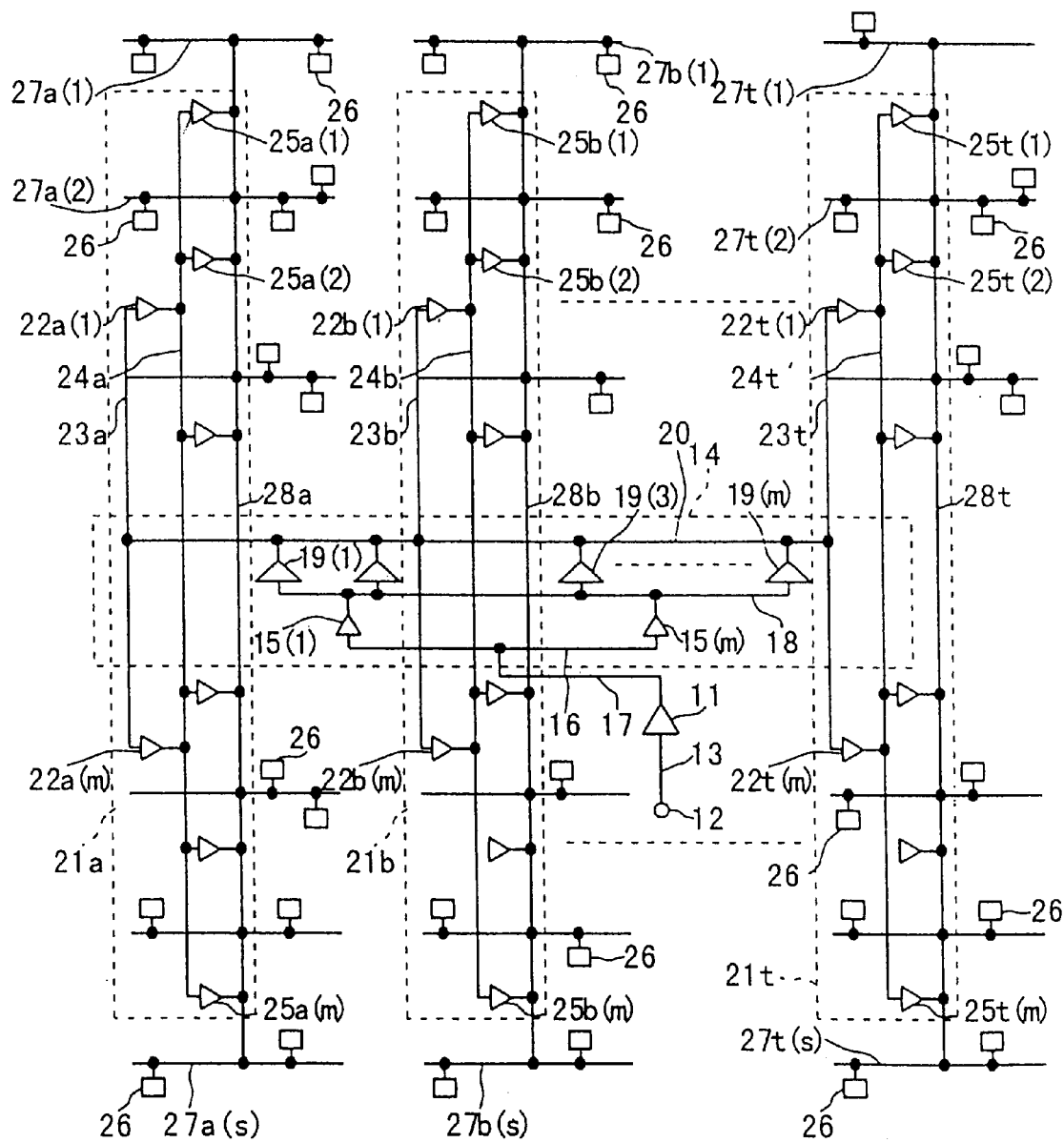
FIG. 3 is a circuit diagram of the first embodiment of the present invention.

Described below with reference to FIG. 3 is a clock driver circuit according to a first exemplary embodiment of the present invention. In FIG. 3, a clock input driver 11 has an input node electrically connected to a clock input pad 12 via a clock input line 13. A first clock driver circuit 14 outputs a clock signal upon receiving a clock signal from the clock input driver 11. The first clock driver circuit 14 is formed in the macro cell layout region 9 located centrally in the first direction in the cell region 2 of the master chip of FIG. 1. The first clock driver circuit 14 has a plurality of predrivers 15(1) through 15(n) and a plurality of main drivers 19(1) through 19(m).

Figure 4:
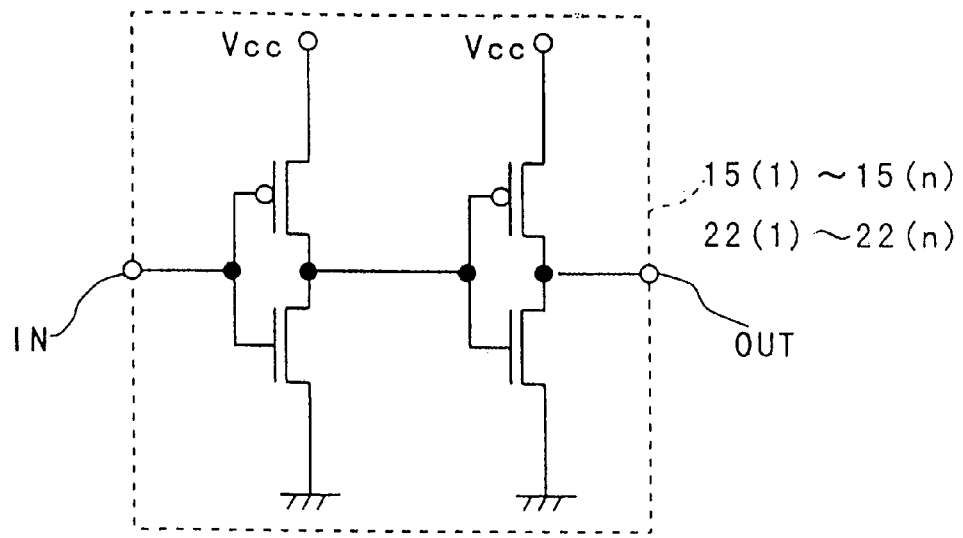
FIG. 4 is a circuit diagram of the predrivers 15(1) through 15(n) and 22(1) through 22(n) shown in FIG. 3.
Figure 5:
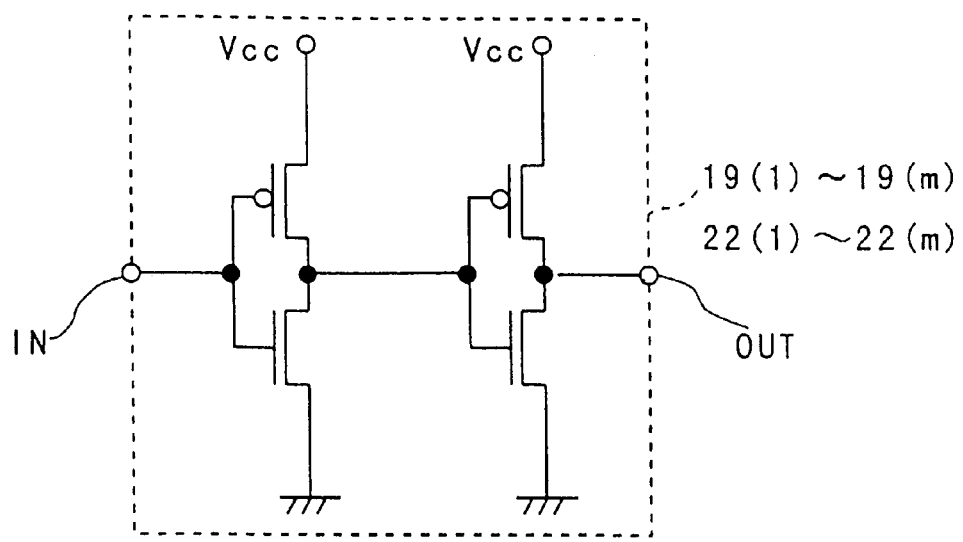
FIG. 5 is a circuit diagram of the main drivers 19(1) through 19(m) and 25(1) through 25(m) shown in FIG. 3.

The plurality of predrivers 15(1) through 15(n) making up the first clock driver circuit 14 have their input nodes IN connected electrically to a first common line 16 and have their output nodes OUT connected electrically to a second common line 18. The first common line 16 is connected electrically to the output node of the clock input driver 11 via a clock output line 17. Illustratively, as shown in FIG. 4, each predriver comprises two cascaded inverter circuits, where each cascaded inverter comprises a serially connected P-type MOS transistor and an N-type MOS transistor. The plurality of main drivers 19(1) through 19(m) have their input nodes IN electrically connected to the second common line 18 and have their output nodes OUT electrically connected to a third common line 20. Illustravely, as shown in FIG. 5, each main driver also comprises two cascaded inverter circuits, where each cascaded inverter comprises a serially connected P-type MOS transistor and an N-type MOS transistor.

Although the predrivers 15(1) through 15(n) and the main drivers 19(1) through 19(m) each comprise two cascaded inverter circuits, many more inverter circuits may be combined to form each driver, as will be appreciated by those skilled in the art. Preferably, however, the number of inverter circuits constituting each predriver and the number of inverter circuits making up each main driver should comprise an even number when added up.

Second clock driver circuits 21a through 21t correspond to one of a plurality of regions (i.e., t divisions) divided from a plurality of macro cell regions 9. More specifically, the macro cell regions are divided into the plurality of divisions in the second direction in the cell region 2 of the master chip shown in FIG. 1. Each second clock driver circuit 21a through 21t supplies a clock signal to the second macro cells in the corresponding division.

Namely, the second macro cells in each division are fed with a clock signal from the corresponding second clock driver circuit 21a through 21t. In operation, the second clock driver circuits 21a through 21t receive the clock signal from the first clock driver circuit 14 and supply in turn the corresponding second macro cells with a clock signal each. Because the second clock driver circuits 21a through 21t have the same circuit construction, the description that follows will center on the second clock driver circuit 21a as representative of these circuits. In this context, the subscripts a, b, and t of the reference numerals are omitted but are assumed below as they simply identify the individual clock driver circuits.

Each of a plurality of predrivers 22(1) through 22(m) has input nodes IN electrically connected to a fourth common line 23, and output nodes OUT electrically connected to a fifth common line 24. The fourth common line 23 is connected electrically to the third common line 20. Illustratively, as shown in FIG. 4, each predriver comprises two cascaded inverter circuits including a serially connected P-type MOS transistor and an N-type MOS transistor.

Each of a plurality of main drivers 25(1) through 25(m) has input nodes IN electrically connected to the fifth common line 24, and output nodes OUT electrically connected to a sixth common line 28. The sixth common line 28 is connected to a plurality of clock signal supply lines 27(1) through 27(s) which in turn are connected electrically to the clock input nodes of the internal circuits (second macro cells) 26 requiring a clock signal each. As shown in FIG. 5, each main driver also comprises illustratively two cascaded inverter circuits including a serially connected P-type MOS transistor and an N-type MOS transistor.

Although the predrivers 22(1) through 22(m) and the main drivers 25(1) through 25(m) each comprise two cascaded inverter circuits, other alternative arrangements are also possible according to the invention. For example, many more inverter circuits may be combined to form each driver. Preferably, however, the number of inverter circuits comprising each predriver and the number of inverter circuits making up each main driver should form an even number when added up. As another alternative, the clock input driver 11 may comprise two cascaded inverter circuits in the same manner as the predrivers 15(1) through 15(n) and 22(1) through 22(m) as well as the main drivers 19(1) through (m) and 25(1) through 25(m) in FIGS. 4 and 5.

Below is a description of the first clock driver circuit 14 and the second clock driver circuits 21a through 21t of which the circuit construction is shown in FIG. 3 which form the master chip shown in FIGS. 1 and 2. In the example described below, the driver circuits are grouped into three divisions in the second direction in the cell region 2 of the master chip. Each of the three divisions comprises the second clock driver circuits 21a through 21t. Although three second clock driver circuits 21a through 21c are illustratively described in the example, the subscript t is not limited to a maximum of 3 but may be any integer of at least 2 or greater. Whereas FIG. 6 does not include for purpose of simplification and illustration any power supply line pair made of a power supply line and a ground line, the power supply line pairs of the first exemplary embodiment are actually arranged linearly at predetermined distances apart (e.g., by 210 basic cells or BC where one basic cell means its width in the first direction, and is 2.65μm in this exemplary embodiment) across the cell region 2 in the second direction on the principal plane of the semiconductor substrate 1. Because the cell region 2 on the semiconductor substrate 1 in the first exemplary embodiment extends 9 mm in the second direction, each divided portion is furnished with a plurality of power supply line pairs.

The first clock driver circuit 14 is described below. The plurality of predrivers 15(1) through 15(n) comprising the first clock driver circuit 14 are arranged at predetermined distances apart and are located in one of the plurality of macro cell layout regions 9, i.e., in the centrally located macro cell layout region 9 (called the driver macro cell layout region 9 hereafter) in the case of the first exemplary embodiment. As shown in detail in FIG. 7, the predrivers 15(1) through 15(n) are each located where the driver macro cell layout region 9 intersects the power supply line pair comprising a power supply line 31 and a ground line 32, i.e., each predriver is located in the driver macro cell layout region 9 between the power supply line 31 and the ground line 32 comprising each power supply line pair.

The wiring in each of the predrivers 15 comprises at least one of a first or second wiring, as with the wiring in the logic circuits acting as first macro cells 40, wiring in the internal circuits working as second macro cells 20, wiring between the logic circuits, and wiring between the logic circuits on the one hand and the internal circuits on the other. The first wiring is formed linearly in the second direction (crosswise in FIG. 7), and the second wiring is arranged linearly in the first direction (longitudinally in FIG. 7). The first wiring comprises the first electrical conductor layer formed together with an interposing interlayer insulation film over the electrode pairs constituting the basic cells 8. The second wiring comprises the second electrical conductor layer formed together with an interposing interlayer insulation film over the first electrical conductor layer. The positions of the first and the second electrical conductor layers may be switched vertically, for example. The first and the second electrical conductor layers comprise aluminum layers including an aluminum alloy layer.

The power supply line 31 is fed with a supply potential and the ground line 32 with a ground potential. The power supply line 31 and ground line 32 comprising each power supply line pair are contiguous to and in parallel with each other, and are formed by the second electrical conductor layer. The power supply line pairs each comprise the power supply line 31 and ground line 32 and are formed linearly across the cell region 2 in the first direction on the principal plane of the semiconductor substrate 1. In the first exemplary embodiment, the distance between the outer periphery of the power supply line 31 and that of the ground line 32 forming each power supply line pair is 46 BC (basic cells). This means that each predriver 15 may be readily formed between the power supply line 31 and ground line 32.

Figure 7:
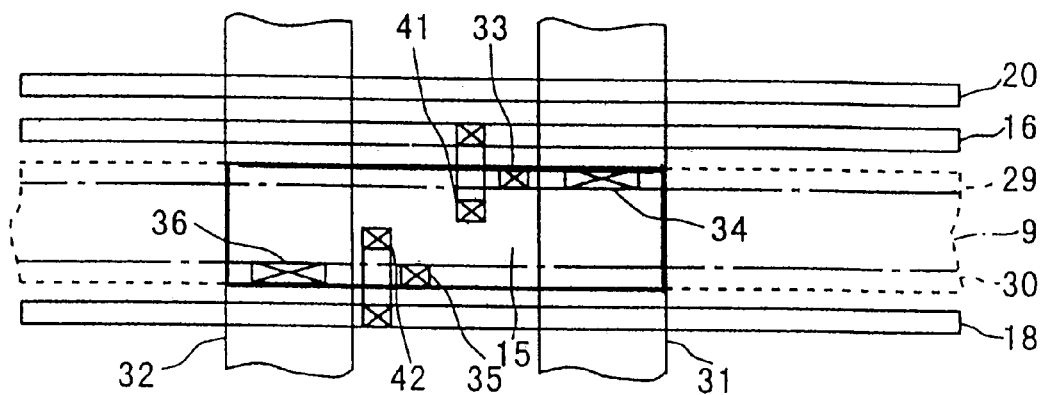
FIG. 7 is a partially enlarged plan pattern view of the predrivers 15(1) through 15(n) of the first clock driver circuit 14 shown in FIG. 6.

In FIG. 7, the length of the predriver 15 in the second direction is shown ranging from the outer periphery of the power supply line 31 to that of the paired ground line 32. However, other alternative arrangements are also possible according to the invention. For example, depending on its structure, the predriver 15 may alternatively be shorter than the distance between the outer periphery of the power supply line 31 and that of the paired ground line 32, as long as each predriver 15 is located between the power supply line 31 and the paired ground line 32 comprising each power supply line pair.

As illustrated in FIG. 7, each predriver 15 is fed with the supply potential Vcc from the power supply line 31 via another power supply line 29; the predriver 15 is also supplied with the ground potential GND from the ground line 32 connected to the driver via another ground line 30. The power supply lines 29 comprise the first electrical conductor layer and are connected electrically to the predrivers 15 via contact holes 33, as well as, to the power supply lines 31 via contact holes 34. The ground lines 30 comprise the first electrical conductor layer and are connected electrically to the predrivers 15 via contact holes 35, as well as, to the ground lines 32 via contact holes 36.

The main drivers 19(1) through 19(m) comprising the first clock driver circuit 14 are formed at predetermined distances apart. In the first exemplary embodiment, the main drivers 19 and predrivers 15 are located alternately in the driver macro cell layout region. However, other alternative arrangements are also possible according to the present invention. For example, the driver arrangement may be varied depending on the number of predrivers 15 and main drivers 19 incorporated. As shown in more detail in FIG. 8, each main driver 19 is formed where each power supply line pair made of the power supply line 31 and ground line 32 intersects the macro cell layout region 9, i.e., each main driver is formed in the driver macro cell layout region 9 between the power supply line 31 and ground line 32 constituting each power supply line pair.

Figure 8:
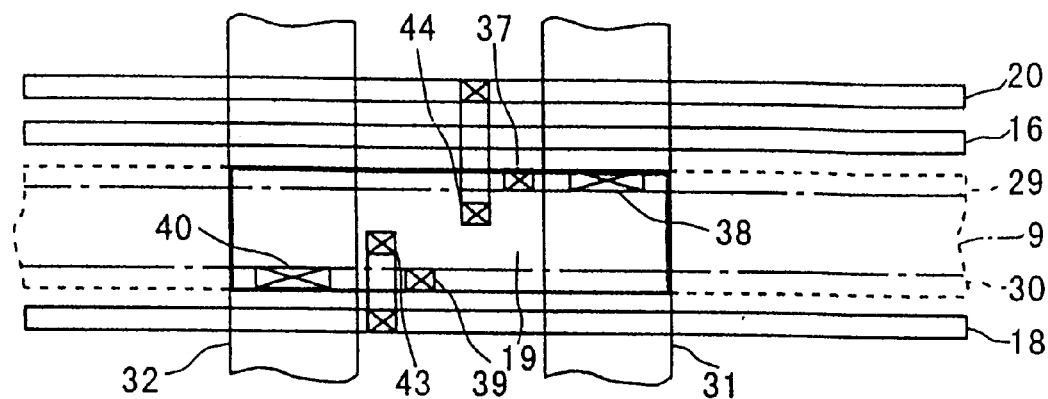
FIG. 8 is a partially enlarged plan pattern view of the main drivers 19(1) through 19(m) of the first clock driver circuit 14 shown in FIG. 6.

As in the case of the predrivers 15, the wiring inside each main driver 19 is formed by at least one of first or second wiring where the first wiring is formed linearly in the second direction and the second wiring is arranged linearly in the first direction. Each main driver 19 may be readily formed between the power supply line 31 and its paired ground line 32. In FIG. 8, the length of each main driver 19 in the second direction is shown ranging from the outer periphery of the power supply line 31 to that of its paired ground line 32. However, other alternative arrangements are also possible. For example, depending on its structure, the main driver 19 may alternatively be shorter than the distance between the outer periphery of the power supply line 31 and that of the paired ground line 32, as long as each main driver 19 is located between the power supply line 31 and the paired ground line 32 comprising the power supply line pair.

As illustrated in FIG. 8, each main driver 19 is fed with the supply potential Vcc from the power supply line 31 via another power supply line 29; the main driver 19 is also supplied with the ground potential GND from the ground line 32 connected to the driver via another ground line 30. The power supply lines 29 are connected electrically to the main drivers 19 via contact holes 37, as well as, to the power supply lines 31 via contact holes 38. The ground lines 30 are connected electrically to the main drivers 19 via contact holes 39, as well as, to the ground lines 32 via contact holes 40. In the area other than that between the power supply line 31 and ground line 32 constituting the power supply line pair in the driver macro cell layout region 9, first macro cells 55 and second macro cells 26 are suitably arranged.

Figure 6:
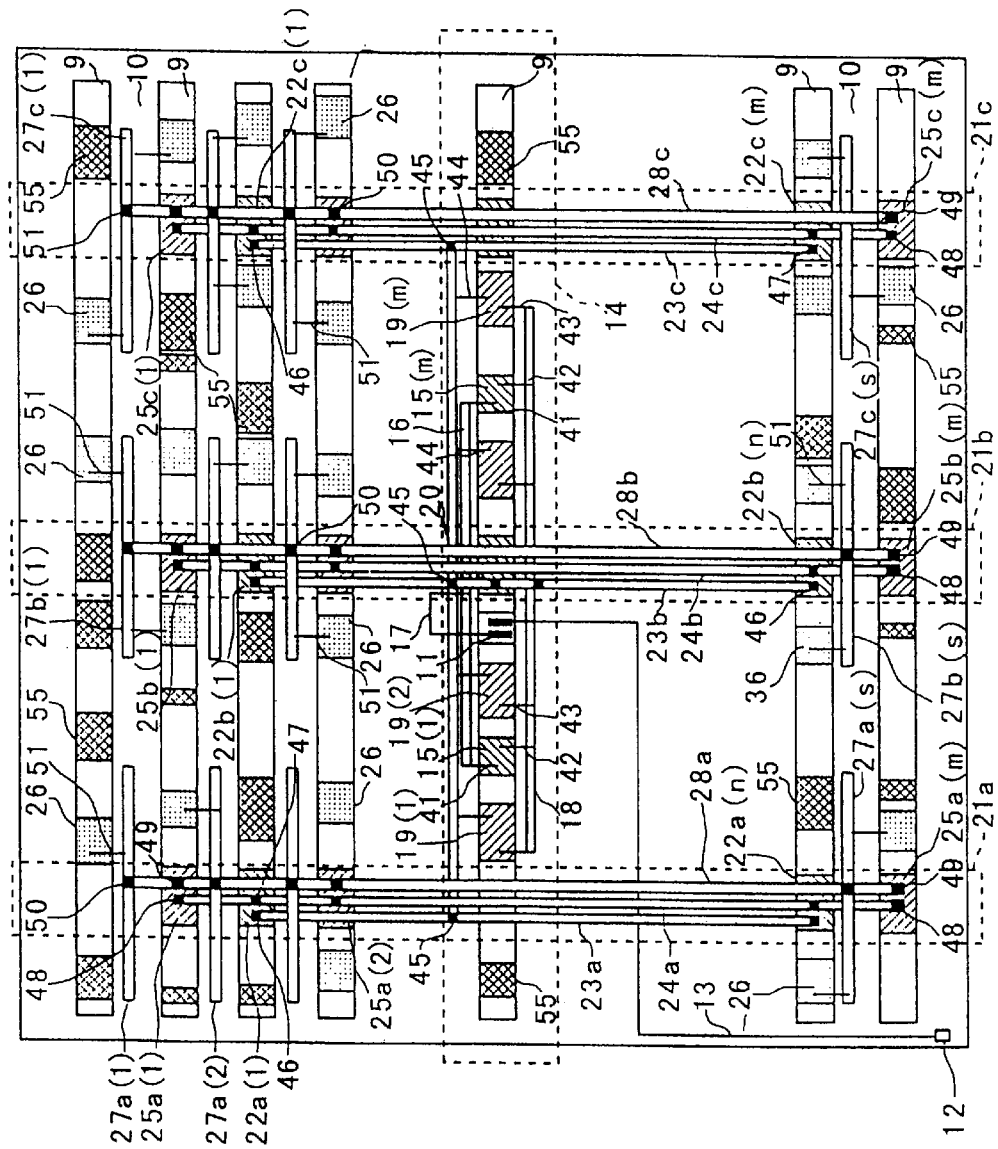
FIG. 6 is a plan pattern view of a semiconductor integrated circuit device according to a first embodiment of the present invention.

As shown in FIG. 6, the first common line 16 is arranged linearly in the second direction along the driver macro cell layout region 9. The first common line 16 is formed by the first electrical conductor layer. As shown in FIG. 7, the first common line 16 is connected electrically via wiring 41 to the input nodes of the predrivers 15(1) through 15(n) so as to short-circuit these nodes. The wiring 41 is formed by the second electrical conductor layer and arranged linearly in the first direction.

As depicted in FIG. 6, the second common line 18 is arranged linearly in the second direction along the driver macro cell layout region 9. The second common line 18 is formed by the first electrical conductor layer. As shown in FIG. 7, the second common line 18 is connected electrically via wiring 42 to the output nodes of the predrivers 15(1) through 15(n) so as to short-circuit these output nodes. The wiring 42 is formed by the second electrical conductor layer and arranged linearly in the first direction. Furthermore, as illustrated in FIG. 8, the second common line 18 is connected electrically via wiring 43 to the input nodes of the main drivers 19(1) through 19(m) thereby short-circuiting these input nodes. The wiring 43 is formed by the second electrical conductor layer and arranged linearly in the first direction.

As illustrated in FIG. 6, the third common line 20 is also arranged linearly in the second direction along the driver macro cell layout region 9. The third common line 20 is formed by the first electrical conductor layer. As shown in FIG. 8, the third common line 20 is connected electrically via wiring 44 to the output nodes of the main drivers 19(1) through 19(m) so as to short-circuit these nodes. The wiring 44 is formed by the second electrical conductor layer and arranged linearly in the first direction. The line width of the third common line 20 is made greater than that of the first or second common line 16 or 18 for the reasons explained below.

The first common line 16 is connected to the input nodes of the plurality of predrivers 15(1) through 15(n). As shown in FIG. 4, the input nodes IN are connected to the gate electrodes of P-type and N-type MOS transistors. Thus the load capacity connected to the first common line 16 is small. The second common line 18 is connected to the input nodes of the plurality of main drivers 19(1) through 19(m). As illustrated in FIG. 5, the input nodes IN are also connected to the gate electrodes of P-type and N-type POS transistors. Thus the load capacity connected to the second common line 18 is also small. By contrast, the third common line 20 is connected via fourth common lines 23a through 23c to the input nodes of a plurality predrivers 22a(1) through 22a(m), 22b(1) through 22b(m) and 22c(1) through 22c(m) in the clock driver circuits 21a through 21c. This means that the load capacity connected to the third common line 20 is larger than that connected to the first or the second common line 16 or 18. Furthermore, the second common line 18 is made greater in line width than the first common line 16 depending on the different load capacities connected.

The three second clock driver circuits 21a through 21c are described below. As shown in FIG. 6, the second clock driver circuits 21a trough 21c are located corresponding to three divisions made of a plurality of macro cell layout regions 9 arranged in the second direction (crosswise in FIG. 6) in the cell region 2 of the semiconductor substrate 1. The second clock driver circuit 21a is located in the middle of the left one-third divided portion of FIG. 6 in the second direction. The second clock driver circuit 21b is located centrally in the middle one-third divided portion of FIG. 6 in the second direction. The second clock driver circuit 21c is located in the middle of the right one-third divided portion of FIG. 6 in the second direction. In other words, the three clock driver circuits 21a through 21c are arranged in the second direction.

Each of the second clock driver circuits 21a through 21c corresponds to the macro cell layout region interposed between the power supply line 31 and ground line 32 making up the power supply line pair located centrally in the second direction of the corresponding divided portion. The macro cell layout region accommodates the predrivers 22a(1) through 22a(m), 22b(1) through 22b(m) and 22c(1) through 22c(m) as well as the main drivers 25a(1) through 25a(m), 25b(1) through 25b(m) and 25c(1) through 25c(m).

Although the three second clock driver circuits 21a through 21c are furnished in various locations as described, they have the same circuit construction. Thus the clock driver circuit 21a alone will be described below with reference to FIG. 6 as the representative of the three circuits for illustration and simplification. The subscripts a, b, and c of the reference numerals in FIG. 6 are omitted but assumed in the following description.

The predrivers 22(1) through 22(m) constituting the second clock driver circuit 21 are formed at predetermined distances apart, located along a single straight line in the first direction, and furnished to each of at least two of the plurality of macro cell layout regions 9 (n regions in this setup). With the first exemplary embodiment, the predetermined distance between every two adjacent predrivers 22 is equivalent to distance of every other macro cell layout region. However, alternative distancing arrangements are also possible according to the present invention. For example, the distances between the predrivers 22 may be determined appropriately depending on the number of predrivers 22 configured.

Figure 9:
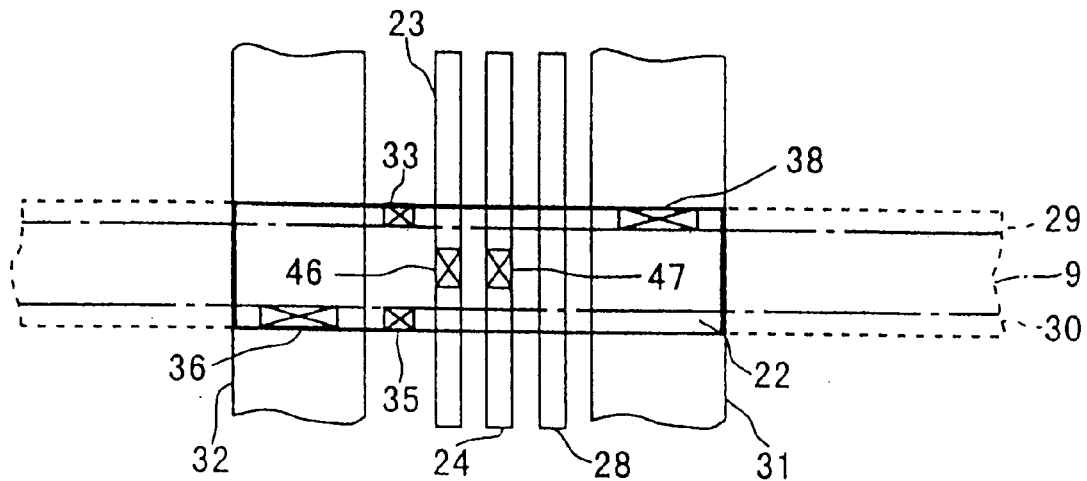
FIG. 9 is a partially enlarged plan pattern view of the predrivers 22a(1) through 22a(n), 22b(1) through 22b(n) and 22c(1) through 22c(n) of the second clock driver circuits 21a through 21c shown in FIG. 6.

More specifically, as shown in FIG. 9, each predriver 22 is formed where the power supply pair made of the power supply line 31 and the ground line 32 intersects the macro cell layout region 9, i.e., each predriver is formed in the macro cell layout region 9 between the power supply line 31 and ground line 32 constituting each power supply line pair. As with the wiring inside the predrivers 15 of the first clock driver circuit 14 shown in FIG. 7, the wiring inside each predriver 22 is constituted by at least one of first and second wiring. The first wiring is arranged linearly in the second direction, and the second wiring is formed linearly in the first direction.

In FIG. 9, the length of each predriver 22 in the second direction is shown ranging from the outer periphery of the power supply line 31 to that of the paired ground line 32. However, other arrangements are also possible according to the invention. For example, depending on its structure, the predriver 22 may alternatively be shorter than the distance between the outer periphery of the power supply line 31 and that of the paired ground line 32, as long as each predriver 22 is located between the power supply line 31 and the paired ground line 32 constituting each power supply line pair.

As illustrated in FIG. 9, each predriver 22 is fed with the supply potential Vcc from the power supply line 31 via another power supply line 29. The predriver 22 is also supplied with the ground potential GND from the ground line 32 connected to the driver via another ground line 30. The power supply lines 29 are furnished in the second direction all along the macro cell layout region 9 on one side thereof (top side in FIG. 9). The power supply lines 29 are formed by the first electrical conductor layer and are connected electrically to the predrivers 22 via contact holes 33, as well as, to the power supply lines 31 via contact holes 38. The ground lines 30 are furnished in the second direction all along the macro cell layout region 9 on another side thereof (bottom side in FIG. 9). The ground lines 30 are formed by the first electrical conductor layer and are connected electrically to the predrivers 22 via contact holes 35, as well as, to the ground lines 32 via contact holes 36.

The main drivers 25(1) through 25(m) are formed at predetermined distances apart along a single straight line in the first direction, and are furnished to each of at least two (as many as m in this embodiment) macro cell layout regions 9 other than those in which the predrivers 22(1) through 22(m) are formed. With the first exemplary embodiment, the predetermined distance between every two adjacent main drivers is equivalent to the distance of each other macro cell layout region. In other words, the main drivers 25 and predrivers 22 are arranged alternately along a single straight line in the first direction. Of course, other arrangements are also possible according to the invention. For example, the driver arrangement may be varied depending on the number of main drivers 25 incorporated. As shown in more detail in FIG. 10, each main driver 25 is formed where each power supply line pair made of the power supply line 31 and ground line 32 intersects the macro cell layout region 9, i.e., each main driver is formed in the macro cell layout region 9 between the power supply line 31 and ground line 32 constituting each power supply line pair.

Figure 10:
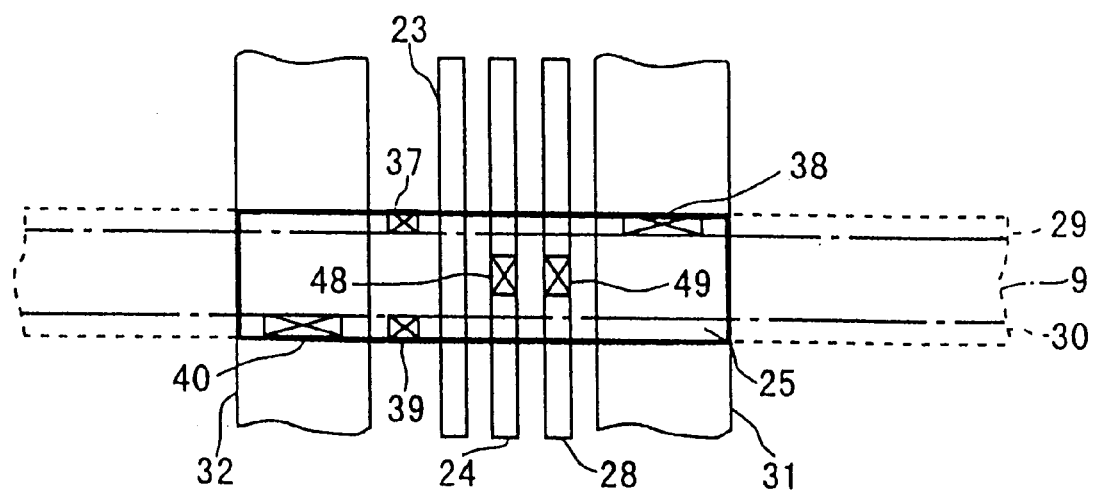
FIG. 10 is a partially enlarged plan pattern view of the main drivers 25a(1) through 25a(n), 25b(1) through 25b(n) and 25(1) through 25c(n) of the second clock driver circuits 21a through 21c shown in FIG. 6.

As in the case of predrivers 22, the wiring inside each main driver 25 comprises at least one of first and second wiring. The first wiring being formed linearly in the second direction, and the second wiring being arranged linearly in the first direction. Each main driver 25 may be readily formed between the power supply line 31 and its paired ground line 32. In FIG. 10, the length of each main driver 25 in the second direction is shown ranging from the outer periphery of the power supply line 31 to that of its paired ground line 32. However, other arrangements are also possible according to the invention. For example, depending on its structure, the main driver 25 may alternatively be shorter than the distance between the outer periphery of the power supply line 31 and that of the paired ground line 32, as long as each main driver 25 is located between the power supply line 31 and the paired ground line 32 constituting the power supply line pair.

As illustrated in FIG. 10, each main driver 25 is fed with the supply potential Vcc from the power supply line 31 via another power supply line 29. The main driver 25 is also supplied with the ground potential GND from the ground line 32 connected to the driver via another ground line 30. The power supply lines 29 are connected electrically to the main drivers 25 via contact holes 37 as well as to the power supply lines 31 via contact holes 38. The ground lines 30 are connected electrically to the main drivers 25 via contact holes 39, as well as, to the ground lines 32 via contact holes 40.

As shown in FIG. 6, the fourth common line 23 is arranged linearly in the first direction over the plurality of predrivers 22(1) through 22(m) and the plurality of main drivers 25 (1) through 25 (m). The fourth common line 23 is formed by the second electrical conductor layer, and is located between the power supply line 31 and the paired ground line 32 making up the power supply line and in parallel with the paired lines. As depicted in FIG. 9, the fourth common line 23 is connected electrically to the input nodes of the predrivers 22(1) through 22(m) via contact holes 46 so as to short-circuit these nodes. Furthermore, as shown in FIG. 6, the fourth common line 23 is connected electrically via a contact hole 45 to the third common line 20 at a point of intersection therebetween.

As depicted in FIG. 6, the fifth common line 24 is arranged linearly in the first direction over the plurality of predrivers 22(1) through 22(m) and the plurality of main drivers 25 (1) through 25 (m). The fifth common line 24 is formed by the second electrical conductor layer, and is located between the power supply line 31 and ground line 32 making up the power supply line and in parallel with the fourth common line 23. As illustrated in FIG. 9, the fifth common line 24 is connected electrically to the output nodes of the predrivers 22(1) through 22(m) via contact holes 47 so as to short-circuit these output nodes. In addition, as shown in FIG. 10, the fifth common line 24 is connected electrically to the input nodes of the main drivers 25(1) through 25(m) via contact holes 48, thus short-circuiting these input nodes.

As illustrated in FIG. 6, the sixth common line 28 is also arranged linearly in the first direction over the plurality of predrivers 22(1) through 22(m) and the plurality of main drivers 25(1) through 25(m). The sixth common line 28 is formed by the second electrical conductor layer, and is located between the power supply line 31 and ground line 32 making up the power supply line pair and is also in parallel with the fourth common line 23. As depicted in FIG. 10, the sixth common line 28 is connected electrically to the output nodes of the main drivers 25(1) through 25(m) via contact holes 49 so as to short-circuit these nodes.

As shown in FIG. 6, the plurality of clock signal supply lines 27(1) through 27(s) are arranged linearly in the second direction corresponding to the plurality of macro cell layout regions 9 in which the second macro cells 26 are located. In the first embodiment, one clock signal supply line 27 is furnished to every one of the macro cell layout regions 9. Alternatively, one clock signal supply line 27 may be furnished to every contiguous two of the macro cell layout regions 9 in a one-to-two correspondence. As another alternative, the clock signal supply lines 27 may be furnished to only those macro cell layout regions 9 where the second macro cells 26 are located. In the latter case, if a second macro cell 29 is furnished to every contiguous two of the macro cell layout regions 9, every two contiguous macro cell layout regions may be provided with one clock signal supply line 27.

The clock signal supply lines 27(1) through 27(s) are formed by the first electrical conductor layer, and arranged parallel to one another in the wiring regions 10. The clock signal supply lines 27(1) through 27(s) are connected electrically at their center to the sixth common line 28 via contact holes 50. The clock signal supply lines 27(1) through 27(s) are also connected via wiring 51 to the clock input nodes of the internal circuits working as second macro cells 26 in the corresponding macro cell layout regions 9. The wiring 51 is formed by the second electrical conductor layer.

The sixth common line 28 is greater in line width than the fourth and the fifth common lines 23 and 24. The reason for the enlarged width of the sixth common line 28 is as follows. The fourth common line 23 is connected to the input nodes of the plurality of predrivers 22(1) through 22(m). As shown in FIG. 4, the input nodes IN are connected to the gate electrodes of P-type and N-type MOS transistors. Thus the load capacity connected to the fourth common line 23 is small. The fifth common line 24 is connected to the input nodes of the plurality of main drivers 25(1) through 25(m). As illustrated in FIG. 5, the input nodes IN are also connected to the gate electrodes of P-type and N-type POS transistors. Thus the load capacity connected to the fifth common line 24 is also small. By contrast, the sixth common line 28 is connected to the plurality of clock signal supply lines 27(1) through 27(s), as well as, to the clock input nodes of the plurality of internal circuits 26. This means that the load capacity connected to the sixth common line 28 is large. Furthermore, the fifth common line 24 is made greater in line width than the fourth common line 23 depending on the different load capacities connected.

As illustrated in FIG. 6, the clock input driver 11 is located centrally in the second direction in the macro cell layout region 9 accommodating the first clock driver circuit 14. In the first exemplary embodiment, the clock input driver 11 is located between the power supply line 31 and the paired ground line 32 constituting the power supply line pair located centrally in the second direction. The input node of the clock input driver 11 is connected electrically via the clock input line 13 to the clock input pad 12 formed on the principal plane of the semiconductor substrate. The clock input line 13 is formed by first and second wiring, the first wiring being made of the first electrical conductor layer and extending in the second direction, the second wiring being constituted by the second electrical conductor layer and extending in the first direction.

The output node of the clock input driver 11 is electrically connected to the first common line 16 via the clock output line 17. The clock output line 17 is formed by first and second wiring, where the first wiring is made of the first electrical conductor layer and extends in the second direction and the second wiring is composed of the second electrical conductor layer and extends in the first direction. One end of the clock output line 17 is electrically connected to the output node of the clock input driver 11, and the other end of the line 17 is electrically connected to the middle of the first common line 16 in the second direction.

In FIG. 6, the first macro cells 55 acting as logic circuits and the second macro cells 26 working as internal circuits requiring clock signals are shown randomly for purpose of simplification and illustration. In practice, the first and second macro cells 55 and 26 are formed close to one another all over the macro cell layout regions 9 except the areas between the power supply line 31 and ground line 32 constituting each power supply line pair, although there do exist insulating regions between the macro cells, generally with one basic cell ensuring electrical insulation between every two macro cells.

The following is a description of how the semiconductor integrated circuit device of the above-described construction works from the time a clock signal is input to the clock input pad 12 until the clock signal enters the clock input nodes of the internal circuits acting as the second macro cells 26. When a clock signal is input from the outside to the clock input pad 12, the input clock signal is forwarded to the clock input driver 11 via the clock input line 13. The clock input driver 11 outputs a clock signal based on the input clock signal. The clock signal thus output is fed via the clock output line 17 to the first common line 16, reaching the predrivers 15a(1) through 15a(n) in the first clock driver circuit 14.

The input nodes of the predrivers 15a(1) through 15a(n) in the first clock driver circuit 14 are short-circuited by the first common line 16, and the load capacity of the predrivers is appreciably small with respect to the first common line 16. For these reasons, the input nodes of the predrivers 15a(1) through 15a(n) develop the same changes (rises and falls) in the clock signal. The changes in the clock signal are the same on the output nodes of the predrivers 15a(1) through 15a(n) in the first clock driver circuit 14. Furthermore, the entire stretch of the second common line 18 is connected in a distributed manner to the output nodes of the predrivers 15a(1) through 15a(n) that are arranged at predetermined distances apart. This arrangement causes the clock signal appearing on the second common line 18 to change in the same fashion along the entire second common line 18. The same applies to the changes in the clock signal appearing on the output nodes of the main drivers 19(1) through 19(m) whose input nodes are short-circuited by the second common line 18.

The output nodes of the main drivers 19(1) through 19(m) are arranged at predetermined distances apart, and connected in a distributed manner to the entire stretch of the third common line 20. This arrangement causes the changes in the clock signal appearing on the third common line 20 to be the same along its entire stretch. The clock signal reaching the third common line 20 is forwarded from there to fourth common lines 23a through 23t (described as the lines 23a through 23c hereunder) through points of intersection between the lines 23a and 23c on the one hand and the third common line 20 on the other hand. The clock signal is then fed to a plurality of predrivers 22a(1) through 22a(n), ..., 22t(1) through 22t(n) (described as the predrivers 22c(1) through 22c(n) hereunder) in the second clock driver circuits 21a through 21t (described as the circuits 21a through 21c hereunder).

The input nodes of the predrivers 22a(1) through 22a(n), 22b(1) through 22b(n) and 22c(1) through 22c(n) in the second clock driver circuits 21a through 21c are short-circuited respectively by the fourth common lines 23a through 23c, and the load capacity of the predrivers is appreciably small with respect to the fourth common lines 23a through 23c. For these reasons, the input nodes of the predrivers 22a(1) through 22a(n), 22b(1) through 22b(n) and 22c(1) through 22c(n) develop the same changes in the clock signal.

The changes in the clock signal are the same on the output nodes of the predrivers 22a(1) through 22a(n), 22b(1) through 22b(n) and 22c(1) through 22c(n). Furthermore, the entire stretches of the fifth common lines 24a through 24c are connected in a distributed manner to the output nodes of the predrivers 22a(1) through 22a(n), 22b(1) through 22b(n) and 22c(1) through 22c(n) that are arranged at predetermined distances apart. This arrangement causes the clock signal appearing on each of the fifth common lines 24a through 24c to change in the same fashion along their entire stretches. The same applies to the changes in the clock signal appearing on the output nodes of the main drivers 25a(1) through 25a(m), 25b(1) through 25b(m) and 25c(1) through 25c(m) whose input nodes are short-circuited by the fifth common lines 24a through 24c.

The output nodes of the main drivers 25a(1) through 25a(m), 25b(1) through 25b(m) and 25c(1) through 25c(m) are arranged at predetermined distances apart and connected in a distributed manner to the entire stretches of the sixth common lines 28a through 28c. This setup causes the changes in the clock signal appearing on the sixth common lines 28a through 28c to be the same along their entire stretches. In short, the changes in the clock signal input to the clock input pad 12 remain the same all along the sixth common lines 28a through 28c. In other words, there presence of clock skews is very limited, i.e., temporal discrepancies for the clock signal having entered the clock input pad 12 to reach the sixth common lines 28a through 28c along their entire stretches.

The clock signal transmitted to the sixth common lines 28a through 28c is supplied via the clock signal supply lines 27a(1) through 27a(s), 27b(1) through 27b(s) and 27c(1) through 27c(s) to the clock input nodes of the internal circuits (second macro cells 26) requiring a clock signal each. In this case, the changes in the clock signal are the same at the points of connection between the clock signal supply lines 27a(1) through 27a(s), 27b(1) through 27b(s) and 27c(1) through 27c(s) on the one hand, and the sixth common lines 28a through 28c on the other hand, i.e., at the middle points of the clock signal supply lines. However, the changes in the clock signal at both ends of the clock signal supply lines lag slightly behind those at their middle points.

The individual length of the clock signal supply lines 27a(1) through 27a(s), 27b(1) through 27b(s) and 27c(1) through 27c(s) is set to be one third of the macro cell layout regions 9 extending in the second direction. The individual wiring resistance and individual wiring capacity of the clock signal supply lines 27a(1) through 27a(s), 27b(1) through 27b(s) and 27c(1) through 27c(s) are negligible. In addition, a relatively small number of second macro cells 26 are connected to the clock signal supply lines 27a(1) through 27a(s), 27b(1) through 27b(s) and 27c(1) through 27c(s). As a result, delays of the changes in the clock signal on both ends of the clock signal supply lines 27a(1) through 27a(s), 27b(1) through 27b(s) and 27c(1) through 27c(s), lagging the most behind those at the middle points of the lines, are very small as well. In short, the clock skews are minimized regarding all the second macro cells 26.

As described above, the first exemplary embodiment of the invention offers the following major benefits.

(A) The changes in the clock signal input to the clock input pad 12 occur in the same manner along the entire stretches of the sixth common lines 28a through 28c. There are very small time delays attributable to the presence of the clock signal supply lines 27a(1) through 27a(s), 27b(1) through 27b(s) and 27c(1) through 27c(s). This minimizes any clock skews occurring between clock signals fed to all the second macro cells 26 working as the internal circuits requiring a clock signal each.

(B) The plurality of predrivers 15(1) through 15(n) and main drivers 19(1) through 19(m) constituting the first clock driver circuit 14, and the plurality of predrivers 22a(1) through 22a(n), 22b(1) through 22b(n) and 22c(1) through 22c(n) as well as main drivers 25a(1) through 25a(m), 25b(1) through 25b(m) and 25c(1) through 25c(m) making up the second clock driver circuits 21a through 21c are located between the power supply line 31 and the paired ground line 32 forming each power supply line pair in which neither the first macro cell 55 nor the second macro cell 26 is furnished. This arrangement places the first clock driver circuit 14 and the second clock driver circuits 21a through 21c within the cell region 2 without decreasing the number of the first and second macro cells 55 and 26 to be provided in that region.

(C) The clock input line 13, the clock output line 17, the first through the sixth common lines 16, 18, 20, 23a through 23c, 24a through 24c and 28a through 28c, and the clock signal supply lines 27a(1) through 27a(s), 27b(1) through 27b(s) and 27c(1) through 27c(s) may be designed to be very small in line width. This also minimizes clock skews regarding all the second macro cells 26. Because of a significantly reduced total wiring area occupied by the clock input line 13, by the clock output line 17, by the first through the sixth common lines 16, 18, 20, 23a through 23c, 24a through 24c and 28a through 28c, and by the clock signal supply lines 27a(1) through 27a(s), 27b(1) through 27b(s) and 27c(1) through 27c(s), the wiring capacity is also decreased. This in turn lowers power dissipation by the first clock driver circuit 14 and the second clock driver circuits 21a through 21c.

(D) One of the second clock driver circuits 21a through 21c shown in FIG. 6 is regarded as a basic construction block. A lopsided extension, if any, of the cell regions 2 in the second direction is thus compensated by adding a basic construction block attachment. This provides a variety of semiconductor integrated circuit devices having equivalent clock skews.

In the first exemplary embodiment above, the input node of the clock input driver 11 is connected to the input pad 12 via the clock input line 13. Alternatively, a PLL circuit may be interposed between the input node of the clock input driver 11 and the input pad 12 to stabilize the clock signal entering the clock input driver 11.

Figure 11:
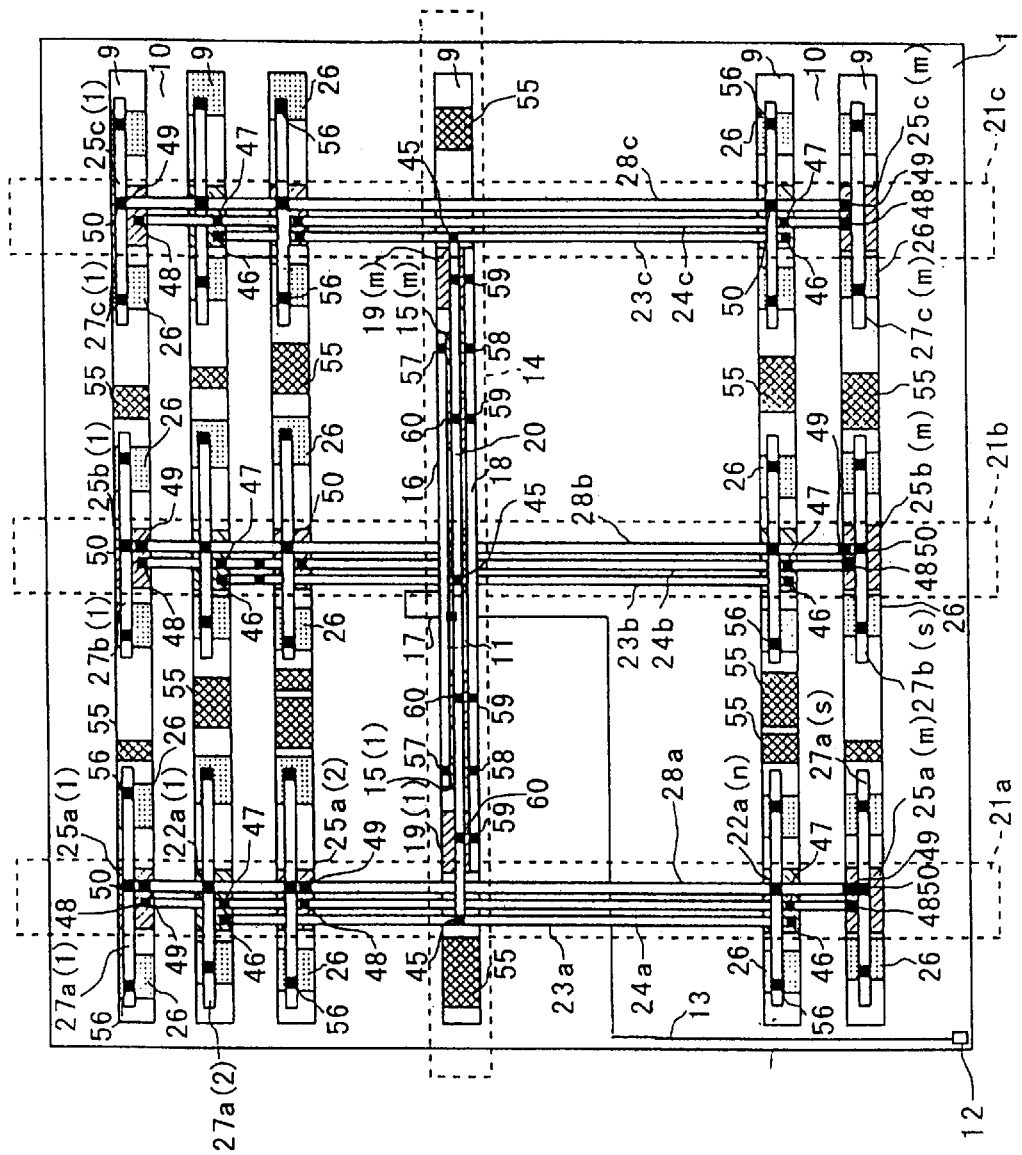
FIG. 11 is a plan pattern view of a semiconductor integrated circuit device according to a second embodiment of the present invention.
Figure 12:
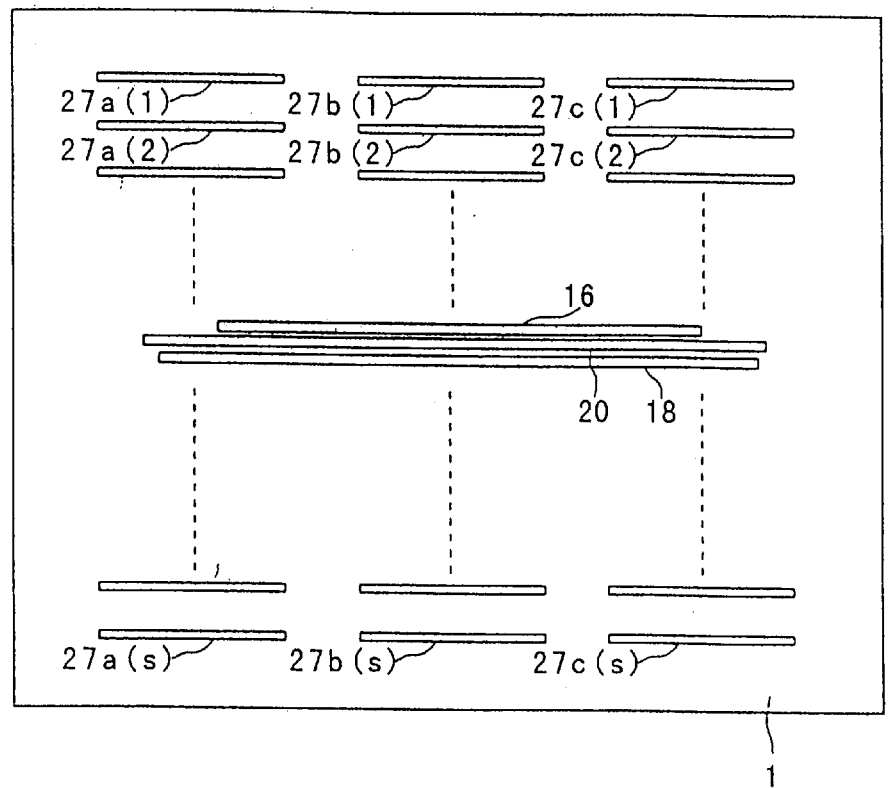
FIG. 12 is a plan pattern view of the third common lines 22a, 22b and 22c, as well as the clock signal supply lines 21a(1) through 21a(s), 21b(1) through 21b(s) and 21c(1) through 21c(s) shown in FIG. 11.
Figure 13:
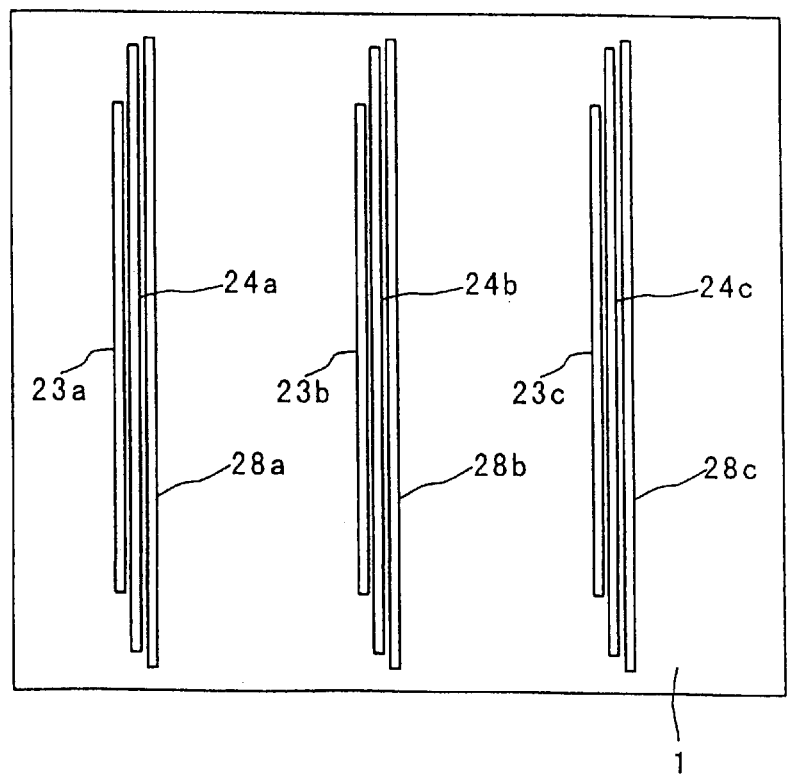
FIG. 13 is a plan pattern view of the fourth through the sixth common lines 23a through 23c, 24a through 24c and 28a through 28c shown in FIG. 11.
Figure 14:
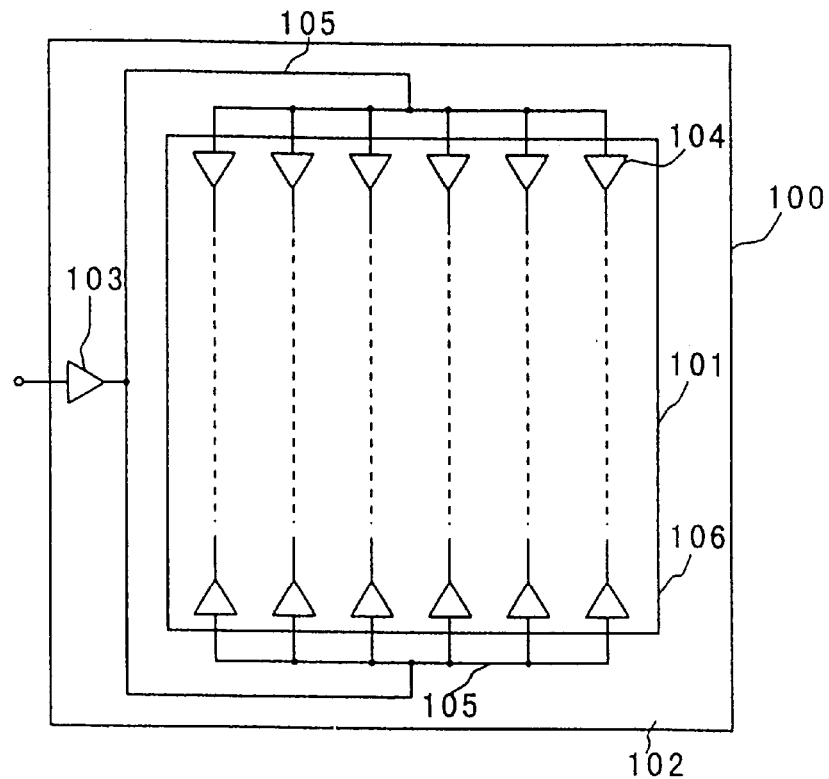
FIG. 14 is a plan pattern view of a conventional semiconductor integrated circuit device.
Figure 15:
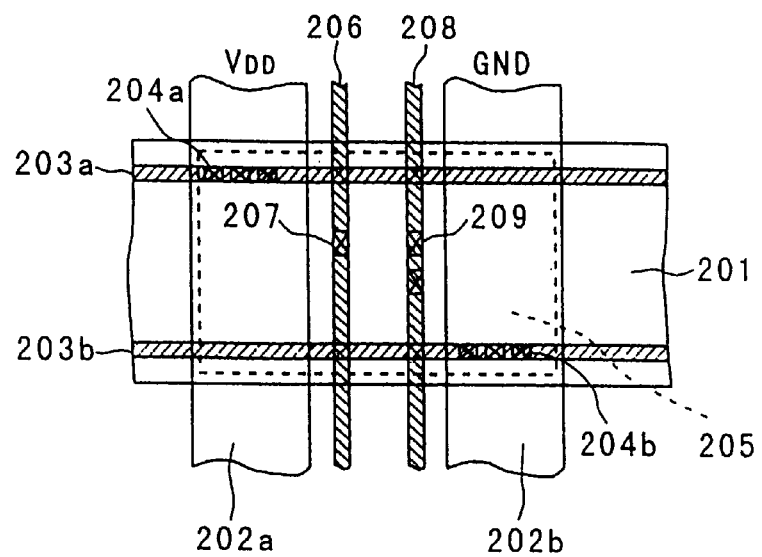
FIG. 15 is a partial plan pattern view of another conventional semiconductor integrated circuit device.

Second Exemplary Embodiment FIGS. 11 through 13 are plan pattern views of a second exemplary embodiment of the present invention. The second exemplary embodiment is similar to the first exemplary embodiment with the exception of the following points. For example, whereas the first embodiment has the first through the third common lines 16, 18 and 20, as well as the clock signal supply lines 27a(1) through 27a(s), 27b(1) through 27b(s) and 27c(1) through 27c(s) formed by the first electrical conductor layer, the second embodiment comprises a third electrical conductor layer different from the first and the second electrical conductor layers. The second exemplary embodiment has the first through the third common lines 16, 18, and 20, as well as the clock signal supply lines 27a(1) through 27a(s), 27b(1) through 27b(s) and 27c(1) through 27c(s) formed by the third electrical conductor layer. The third electrical conductor layer is formed together with an interposing interlayer insulation film over the second electrical conductor layer. The third electrical conductor layer is constituted by aluminum layers including an aluminum alloy layer.

As with the first exemplary embodiment, the first through the third common lines 16, 18 and 20 are formed linearly in the second direction and located above the predrivers 15(1) through 15(n) and main drivers 19(1) through 19(m) of the first clock driver circuit 14. Because the first through the third common lines 16, 18 and 20 are formed by the third electrical conductor layer, they may be located immediately above the driver macro cell layout region 9 accommodating the plurality of predrivers 15(1) through 15(n) and main drivers 19(1) through 19(m). In the second exemplary embodiment, the first through the third common lines 16, 18 and 20 are located immediately above the driver macro cell layout region 9.

The first common line 16 is electrically connected to the input nodes of the plurality of predrivers 15(1) through 15(n) of the first clock driver circuit 14 via contact holes 57. The second common line 18 is electrically connected via contact holes 58 to the output nodes of the predrivers 15(1) through 15(n) and via contact holes 59 to the input nodes of the main drivers 19(1) through 19(m) in the first clock driver circuit 14. The third common line 20 is electrically connected via contact holes 60 to the output nodes of the main drivers 19(1) through 19(m) in the first clock driver circuit 14. The third common line 20 is connected to the fourth common lines 23a through 23c via contact holes 45, as in the case of the first embodiment.

The plurality of clock signal supply lines 27a(1) through 27a(s), 27b(1) through 27b(s) and 27c(1) through 27c(s) correspond respectively to a plurality of macro cell layout regions 9 in which the second macro cell 26 is provided, and are arranged linearly in the second direction immediately above the corresponding macro cell layout regions 9. The clock signal supply lines 27a(1) through 27a(s), 27b(1) through 27b(s) and 27c(1) through 27c(s) are connected via contact holes 56 to the clock input nodes of the internal circuits (i.e., second macro cells 26) furnished to the respective macro cell layout regions 9. As with the first exemplary embodiment, the clock signal supply lines 27a(1) through 27a(s), 27b(1) through 27b(s) and 27c(1) through 27c(s) are electrically connected via contact holes 50 to the sixth common lines 28a through 28c respectively. In FIG. 11, the reference numerals already used in conjunction with the first embodiment designate like or corresponding parts.

The above semiconductor integrated circuit device as practiced according to the second embodiment of the present invention provides the same benefits as those above items (A) through (D) of the first exemplary embodiment and supplements them with further advantages as follows.

(E) Because the clock signal supply lines 27a(1) through 27a(s), 27b(1) through 27b(s) and 27c(1) through 27c(s) are located immediately above the corresponding macro cell layout regions 9, the wiring regions 10 may be utilized efficiently. This arrangement also contributes to reducing the area of the semiconductor substrate 1 and optimizes the wiring (formed by the first and the second electrical conductor layers) for connecting the macro cells 55 and 26 in the wiring regions 10.

(F) The clock signal supply lines 27a(1) through 27a(s), 27b(1) through 27b(s) and 27c(1) through 27c(s) are electrically connected to the input nodes of the second macro cells 26 via the contact holes 56. This signifies a very limited presence of clock skews stemming from the electrical connection.

(G) Because the first through the third common lines 16, 18, and 20 are located immediately above the corresponding macro cell layout regions 9, the wiring regions 10 may be utilized efficiently. This arrangement also contributes to reducing the area of the semiconductor substrate 1.

Although the second embodiment has been shown having the fourth through the sixth common lines 23a through 23c, 24a through 24c and 28a through 28c formed by the second electrical conductor layer as in the case of the first exemplary embodiment, other arrangements are possible according to the invention. For, example, the same effect may be obtained if the fourth through the sixth common lines are formed by a fourth electrical conductor layer different from the first through the third electrical conductor layers. The fourth electrical conductor layer may be formed together with an interposing interlayer insulation film over the third electrical conductor layer. The fourth electrical conductor layer may be constituted by aluminum layers including an aluminum alloy layer. The third and the fourth electrical conductor layers may switch their positions vertically.

Where the third electrical conductor layer is used, or where both the third and the fourth electrical conductor layers are employed, the first through the third common lines 16, 18 and 20, the fourth through the sixth common lines 23a through 23c, 24a through 24c and 28a through 28c, and the clock signal supply lines 27a(1) through 27a(s), 27b(1) through 27b(s) and 27c(1) through 27c(s) may be formed by electrical conductor layers in several variations indicated below. These variations also provide the same effect as the second exemplary embodiment described above.

First Variation

The first through the third common lines 16, 18, and 20 are formed by the first electrical conductor layer. The fourth common lines 23a through 23c, the fifth common lines 24a through 24c and the sixth common lines 28a through 28c are formed by the second electrical conductor layer. The clock signal supply lines 27a(1) through 27a(s), 27b(1) through 27b(s) and 27c(1) through 27c(s) are formed by the third electrical conductor layer.

Second Variation

The first through the third common lines 16, 18, and 20 are formed by the first electrical conductor layer. The fourth common lines 23a through 23c and the fifth common lines 24a through 24c are formed by the second electrical conductor layer. The sixth common lines 28a through 28c and the clock signal supply lines 27a(1) through 27a(s), 27b(1) through 27b(s) and 27c(1) through 27c(s) are formed by the third electrical conductor layer.

Third Variation

The first through the third common lines 16, 18, and 20 are formed by the first electrical conductor layer. The fourth common lines 23a through 23c and the fifth common lines 24a through 24c are formed by the fourth electrical conductor layer. The sixth common lines 28a through 28c and the clock signal supply lines 27a(1) through 27a(s), 27b(1) through 27b(s) and 27c(1) through 27c(s) are formed by the third electrical conductor layer.

Fourth Variation

The first and the second common lines 16 and 18 are formed by the first electrical conductor layer. The third common line 20 and the fourth common lines 23a through 23c are formed by the fourth electrical conductor layer. The fifth common lines 24a through 24c are formed by the second electrical conductor layer. The sixth common lines 28a through 28c and the clock signal supply lines 27a(1) through 27a(s), 27b(1) through 27b(s) and 27c(1) through 27c(s) are formed by the third electrical conductor layer.

Fifth Variation

The first and the second common lines 16 and 18 are formed by the first electrical conductor layer. The third common line 20 is formed by the fourth electrical conductor layer. The fourth common lines 23a through 23c, the fifth common lines 24a through 24c and the sixth common lines 28a through 28c are formed by the second electrical conductor layer. The clock signal supply lines 27a(1) through 27a(s), 27b(1) through 27b(s) and 27c(1) through 27c(s) are formed by the third electrical conductor layer.

Of the variations outlined above, the one having the third common line 20 and the fourth common lines 23a through 23c formed by the same electrical conductor layer electrically connects these lines directly and not via contact holes. This arrangement inhibits increase in the resistance of the electrical connections involved. Likewise, the variations having the sixth common lines 28a through 28c and the clock signal supply lines 27a(1) through 27a(s), 27b(1) through 27b(s) and 27c(1) through 27c(s) formed by the same electrical conductor layer electrically connect these lines directly and not via contact holes. This also suppresses increase in the resistance of the electrical connections involved.

Obviously, numerous additional modifications and variations of the present invention are possible in light of the above teachings. It is therefore to be understood that within the scope of the appended claims, the present invention may be practiced otherwise than as specifically described herein.

What is claimed is:

1. A semiconductor integrated circuit device comprising:

a semiconductor substrate including a plurality of macro cell layout regions arranged in a first direction on a principal plane of said substrate; and a plurality of electrode pairs arranged in a second direction perpendicularly intersecting said first direction in each of said plurality of macro cell layout regions of said semiconductor substrate, wherein each of said plurality of macro cell layout regions on said semiconductor substrate includes a plurality of N-type diffusion areas each arranged in said second direction and a plurality of P-type diffusion areas each arranged in said second direction, each of said plurality of N-type diffusion areas and said plurality of P-type diffusion areas being oriented in said first direction;

each of said plurality of electrode pairs is made up of a first and a second electrode, said first electrode being formed together with an interposing insulation film between contiguous two of said plurality of N-type diffusion areas furnished in each of said plurality of macro cell layout regions, said second electrode being formed together with an interposing insulation film between contiguous two of said plurality of P-type diffusion areas which are arranged along with said first electrode in said first direction and which are furnished in said macro cell layout region in question;

each of said plurality of electrode pairs and said N- and P-type diffusion layers located on both sides of said electrode pair in question constitute a basic cell;

a first macro cell which is made up of a predetermined number of contiguous basic cells and which acts as a logic circuit is furnished to each of said plurality of macro cell layout regions on said semiconductor substrate; and a second macro cell which is made up of a predetermined number of contiguous basic cells and which acts as an internal circuit requiring a clock signal is furnished to each of at least two of said plurality of macro cell layout regions on said semiconductor substrate;

said semiconductor integrated circuit device further comprising:

a first clock driver circuit including a plurality of predrivers and a plurality of main drivers, said plurality of predrivers being arranged predetermined distances apart and formed by a predetermined number of contiguous basic cells in one of said plurality of macro cell layout regions on said semiconductor substrate, said plurality of main drivers being arranged predetermined distances apart and formed by a predetermined number of contiguous basic cells in said macro cell layout regions provided with said plurality of predrivers on said semiconductor substrate;

a first common line formed linearly in said second direction along said macro cell layout region provided with said plurality of predrivers and said plurality of main drivers, said first common line being electrically connected to input nodes of said plurality of predrivers in said first clock driver circuit;

a second common line formed linearly in said second direction along said macro cell layout region provided with said plurality of predrivers and said plurality of main drivers, said second common line being electrically connected to output nodes of said plurality of predrivers as well as to input nodes of said plurality of main drivers in said first clock driver circuit; and a third common line formed linearly in said second direction along said macro cell layout region provided with said plurality of predrivers and said plurality of main drivers, said third common line being electrically connected to output nodes of said plurality of main drivers, wherein said plurality of macro cell layout regions on said semiconductor substrate are divided into a plurality of portions in said second direction, each of said divided portions being provided with a second clock driver circuit;

each of said second clock driver circuits in said corresponding divided portion comprises:

a plurality of predrivers which are composed of a predetermined number of contiguous basic cells and which are linearly arranged, said plurality of predrivers being furnished to each of at least two of said plurality of macro cell layout regions on said semiconductor substrate; and a plurality of main drivers which are composed of a predetermined number of contiguous basic cells, which are each provided with said plurality of predrivers and which are linearly arranged, said plurality of main drivers being furnished to each of at least two macro cell layout regions other than those provided with said plurality of predrivers on said semiconductor substrate, wherein each of said divided portions includes:

a fourth common line formed linearly in said first direction on said plurality of predrivers and said plurality of main drivers in said second clock driver circuit of said divided portion in question, said fourth common line being electrically connected to input nodes of said plurality of predrivers in said second clock driver circuit of said divided portion in question, said fourth common line being further connected electrically to said third common line;

a fifth common line formed linearly in said first direction on said plurality of predrivers and said plurality of main drivers in said second clock driver circuit of said corresponding divided portion, said fifth common line being electrically connected to output nodes of said plurality of predrivers in said second clock driver circuit of said corresponding divided portion, said fifth common line being further connected electrically to input nodes of said plurality of main drivers in said second clock driver circuit of said corresponding divided portion;

a sixth common line formed linearly in said first direction on said plurality of predrivers and said plurality of main drivers in said second clock driver circuit of said corresponding divided portion, said sixth common line being electrically connected to output nodes of said plurality of main drivers in said second clock driver circuit of said corresponding divided portion; and a plurality of clock signal supply lines corresponding to said plurality of macro cell layout regions each having said second macro cell, said plurality of clock signal supply lines being linearly arranged in said second direction and connected electrically to said sixth common line, said plurality of clock signal supply lines being further connected electrically to a clock input node of an internal circuit acting as said second macro cell furnished to said corresponding macro cell layout region.

2. A semiconductor integrated circuit device according to claim 1, wherein said macro cell layout region provided with said first clock driver circuit is located centrally in said first direction.

3. A semiconductor integrated circuit device according to claim 1, wherein said third and said fourth common lines are electrically connected to each other at a point of intersection therebetween.

4. A semiconductor integrated circuit device according to claim 1, further comprising a clock input driver formed on said principal plane of said semiconductor substrate, an input node of said clock input driver being electrically connected via a clock input line to a clock input pad formed on said principal plane of said semiconductor substrate, an output node of said clock input driver being electrically connected to said first common line.

5. A semiconductor integrated circuit device according to claim 4, wherein said clock input driver is located in said macro cell layout region provided with said first clock driver circuit.

6. A semiconductor integrated circuit device according to claim 1, wherein said fourth through said sixth common lines are located centrally in said second direction in said corresponding divided portion; and wherein said central portion of said plurality of clock signal supply lines furnished to said corresponding divided portion is connected electrically to said sixth common line.

7. A semiconductor integrated circuit device according to claim 1, wherein each of said divided portions comprises at least one power supply line pair composed of a power supply line fed with a supply potential and of a ground line adjacent to and in parallel with said power supply line and fed with a ground potential, said power supply line pair being linearly formed in said first direction on said principal plane of said semiconductor substrate; and wherein said plurality of predrivers and said plurality of main drivers in each of said divided portions are located between said power supply line and said ground line constituting said one power supply line pair furnished to said corresponding divided portion.

8. A semiconductor integrated circuit device according to claim 1, wherein wiring inside said logic circuits acting as said first macro cell, wiring inside said internal circuits acting as said second macro cell, wiring between said logic circuits, and wiring between said logic circuits on one hand and said internal circuits on the other are constituted by at least one of first and second wiring, said first wiring being arranged in said second direction and formed by a first electrical conductor layer on said plurality of electrode pairs, said second wiring being arranged in said first direction and formed by a second electrical conductor layer different from said first electrical conductor layer;

wherein said first through said third common lines are formed by said first electrical conductor layer;

wherein said fourth through said sixth common lines are formed by said second electrical conductor layer; and wherein said plurality of clock signal supply lines are formed by said first electrical conductor layer.

9. A semiconductor integrated circuit device according to claim 1, wherein wiring inside said logic circuits acting as said first macro cell, wiring inside said internal circuits acting as said second macro cell, wiring between said logic circuits, and wiring between said logic circuits on one hand and said internal circuits on the other are constituted by at least one of first and second wiring, said first wiring being arranged in said second direction and formed by a first electrical conductor layer on said plurality of electrode pairs, said second wiring being arranged in said first direction and formed by a second electrical conductor layer different from said first electrical conductor layer;

wherein said first through said third common lines are formed by a third electrical conductor layer which differs from said first and said second electrical conductor layers and which is formed on said plurality of electrode pairs;

wherein said fourth through said sixth common lines are formed by a fourth electrical conductor layer which differs from said first through said third electrical conductor layers and which is formed on said plurality of electrode pairs; and wherein said plurality of clock signal supply lines are formed by said third electrical conductor layer, each of said plurality of clock signal supply lines being located immediately above said corresponding macro cell layout region.

10. A semiconductor integrated circuit device according to claim 1, wherein wiring inside said logic circuits acting as said first macro cell, wiring inside said internal circuits acting as said second macro cell, wiring between said logic circuits, and wiring between said logic circuits on one hand and said internal circuits on the other are constituted by at least one of first and second wiring, said first wiring being arranged in said second direction and formed by a first electrical conductor layer on said plurality of electrode pairs, said second wiring being arranged in said first direction and formed by a second electrical conductor layer different from said first electrical conductor layer;

wherein said first through said third common lines are formed by said first electrical conductor layer;

wherein said fourth through said sixth common lines are formed by said second electrical conductor layer; and wherein said plurality of clock signal supply lines are formed by a third electrical conductor layer which differs from said first and said second electrical conductor layers and which is formed on said plurality of electrode pairs, each of said plurality of clock signal supply lines being located immediately above said corresponding macro cell layout region.

11. A semiconductor integrated circuit device according to claim 1, wherein wiring inside said logic circuits acting as said first macro cell, wiring inside said internal circuits acting as said second macro cell, wiring between said logic circuits, and wiring between said logic circuits on said one hand and said internal circuits on the other are constituted by at least one of first and second wiring, said first wiring being arranged in said second direction and formed by a first electrical conductor layer on said plurality of electrode pairs, said second wiring being arranged in said first direction and formed by a second electrical conductor layer different from said first electrical conductor layer;

wherein said sixth common line is formed by a third electrical conductor layer which differs from said first and said second electrical conductor layers and which is formed on said plurality of electrode pairs;

wherein said fourth and said fifth common lines are formed by a fourth electrical conductor layer which differs from said first through said third electrical conductor layers and which is furnished on said plurality of electrode pairs; and wherein said plurality of clock signal supply lines are formed by said third electrical conductor layer, each of said plurality of clock signal supply lines being located immediately above said corresponding macro cell layout region.

12. A semiconductor integrated circuit device according to claim 11, wherein said first through said third common lines are formed by said first electrical conductor layer.

13. A semiconductor integrated circuit device according to claim 1, wherein wiring inside said logic circuits acting as said first macro cell, wiring inside said internal circuits acting as said second macro cell, wiring between said logic circuits, and wiring between said logic circuits on one hand and said internal circuits on the other are constituted by at least one of first and second wiring, said first wiring being arranged in said second direction and formed by a first electrical conductor layer on said plurality of electrode pairs, said second wiring being arranged in said first direction and formed by a second electrical conductor layer different from said first electrical conductor layer;

wherein said first and said second common lines are formed by said first electrical conductor layer;

wherein said third and said fourth common lines are formed by a third electrical conductor layer which differs from said first and said second electrical conductor layers and which is formed on said plurality of electrode pairs;

wherein said fifth common line is formed by said second electrical conductor layer;

wherein said sixth common line is formed by a fourth electrical conductor layer which differs from said first through said third electrical conductor layers and which is formed on said plurality of electrode pairs; and wherein said plurality of clock signal supply lines are formed by said fourth electrical conductor layer, each of said plurality of clock signal supply lines being located immediately above said corresponding macro cell layout region.

14. A semiconductor integrated circuit device according to claim 1, wherein wiring inside said logic circuits acting as said first macro cell, wiring inside said internal circuits acting as said second macro cell, wiring between said logic circuits, and wiring between said logic circuits on one hand and said internal circuits on the other are constituted by at least one of first and second wiring, said first wiring being arranged in said second direction and formed by a first electrical conductor layer on said plurality of electrode pairs, said second wiring being arranged in said first direction and formed by a second electrical conductor layer different from said first electrical conductor layer;

wherein said first and said second common lines are formed by said first electrical conductor layer;

wherein said third common line is formed by a third electrical conductor layer which differs from said first and said second electrical conductor layers and which is formed on said plurality of electrode pairs, said third common line being located immediately above said macro cell layout region provided with said first clock driver circuit;

wherein said fourth through said sixth common lines are formed by said second electrical conductor layer; and wherein said plurality of clock signal supply lines are formed by said third electrical conductor layer, each of said plurality of clock signal supply lines being located immediately above said corresponding macro cell layout region.

15. A semiconductor integrated circuit device comprising:

a semiconductor substrate including a plurality of macro cell layout regions arranged in a first direction on a principal plane of said substrate; and a plurality of electrode pairs arranged in a second direction perpendicularly intersecting said first direction in each of said plurality of macro cell layout regions of said semiconductor substrate, wherein each of said plurality of macro cell layout regions on said semiconductor substrate includes a plurality of N-type diffusion areas each arranged in said second direction and a plurality of P-type diffusion areas each arranged in said second direction, each of said plurality of N-type diffusion areas and said plurality of P-type diffusion areas being oriented in said first direction;

each of said plurality of electrode pairs is made up of a first and a second electrode, said first electrode being formed together with an interposing insulation film between contiguous two of said plurality of N-type diffusion areas furnished in each of said plurality of macro cell layout regions, said second electrode being formed together with an interposing insulation film between contiguous two of said plurality of P-type diffusion areas which are arranged along with said first electrode in said first direction and which are furnished in said macro cell layout region in question;

each of said plurality of electrode pairs and said N- and P-type diffusion layers located on both sides of said electrode pair in question constitute a basic cell;

a first macro cell which is made up of a predetermined number of contiguous basic cells and which acts as a logic circuit is furnished to each of said plurality of macro cell layout regions on said semiconductor substrate; and a second macro cell which is made up of a predetermined number of contiguous basic cells and which acts as an internal circuit requiring a clock signal is furnished to each of at least two of said plurality of macro cell layout regions on said semiconductor substrate.

16. A semiconductor integrated circuit device according to claim 15 further comprising:

a first clock driver circuit including a plurality of predrivers and a plurality of main drivers, said plurality of predrivers being arranged predetermined distances apart and formed by a predetermined number of contiguous basic cells in one of said plurality of macro cell layout regions on said semiconductor substrate, said plurality of main drivers being arranged predetermined distances apart and formed by a predetermined number of contiguous basic cells in said macro cell layout regions provided with said plurality of predrivers on said semiconductor substrate;

a first common line formed linearly in said second direction along said macro cell layout region provided with said plurality of predrivers and said plurality of main drivers, said first common line being electrically connected to input nodes of said plurality of predrivers in said first clock driver circuit;

a second common line formed linearly in said second direction along said macro cell layout region provided with said plurality of predrivers and said plurality of main drivers, said second common line being electrically connected to output nodes of said plurality of predrivers as well as to input nodes of said plurality of main drivers in said first clock driver circuit; and a third common line formed linearly in said second direction along said macro cell layout region provided with said plurality of predrivers and said plurality of main drivers, said third common line being electrically connected to output nodes of said plurality of main drivers, wherein said plurality of macro cell layout regions on said semiconductor substrate are divided into a plurality of portions in said second direction, each of said divided portions being provided with a second clock driver circuit;

each of said second clock driver circuits in said corresponding divided portion comprises:

a plurality of predrivers which are composed of a predetermined number of contiguous basic cells and which are linearly arranged, said plurality of predrivers being furnished to each of at least two of said plurality of macro cell layout regions on said semiconductor substrate; and a plurality of main drivers which are composed of a predetermined number of contiguous basic cells, which are each provided with said plurality of predrivers and which are linearly arranged, said plurality of main drivers being furnished to each of at least two macro cell layout regions other than those provided with said plurality of predrivers on said semiconductor substrate.

17. A semiconductor integrated circuit device according to claim 16 wherein each of said divided portions includes:

a fourth common line formed linearly in said first direction on said plurality of predrivers and said plurality of main drivers in said second clock driver circuit of said divided portion in question, said fourth common line being electrically connected to input nodes of said plurality of predrivers in said second clock driver circuit of said divided portion in question, said fourth common line being further connected electrically to said third common line;

a fifth common line formed linearly in said first direction on said plurality of predrivers and said plurality of main drivers in said second clock driver circuit of said corresponding divided portion, said fifth common line being electrically connected to output nodes of said plurality of predrivers in said second clock driver circuit of said corresponding divided portion, said fifth common line being further connected electrically to input nodes of said plurality of main drivers in said second clock driver circuit of said corresponding divided portion;

a sixth common line formed linearly in said first direction on said plurality of predrivers and said plurality of main drivers in said second clock driver circuit of said corresponding divided portion, said sixth common line being electrically connected to output nodes of said plurality of main drivers in said second clock driver circuit of said corresponding divided portion; and a plurality of clock signal supply lines corresponding to said plurality of macro cell layout regions each having said second macro cell, said plurality of clock signal supply lines being linearly arranged in said second direction and connected electrically to said sixth common line, said plurality of clock signal supply lines being further connected electrically to a clock input node of an internal circuit acting as said second macro cell furnished to said corresponding macro cell layout region.

\* \* \* \* \*